US012803248B2

(12) United States Patent
Warburton et al.

(10) Patent No.: US 12,803,248 B2
(45) Date of Patent: Nov. 17, 2026

(54) SINGLE PHOTON SOURCE FOR GENERATING BRIGHT AND COHERENT SINGLE PHOTONS

(71) Applicant: UNIVERSITÄT BASEL, Basel (CH)

(72) Inventors: Richard J. Warburton, Basel (CH); Alisa Javadi, Basel (CH); Daniel Najer, Rotkreuz (CH); Natasha Tomm, Basel (CH)

(73) Assignee: UNIVERSITÄT BASEL, Basel (CH)

( * ) Notice: Subject to any disclaimer, the term of this patent is extended or adjusted under 35 U.S.C. 154(b) by 883 days.

(21) Appl. No.: 18/005,605

(22) PCT Filed: Jul. 15, 2021

(86) PCT No.: PCT/EP2021/069907
§ 371 (c)(1),
(2) Date: Jan. 15, 2023

(87) PCT Pub. No.: WO2022/013409
PCT Pub. Date: Jan. 20, 2022

(65) Prior Publication Data

US 2023/0344201 A1 Oct. 26, 2023

(30) Foreign Application Priority Data

Jul. 15, 2020 (EP) .................................... 20186087
Jul. 24, 2020 (EP) .................................... 20187758

(51) Int. Cl.
*H01S 5/34* (2006.01)
*G02B 21/06* (2006.01)
(Continued)

(52) U.S. Cl.
CPC ............ *H01S 5/3412* (2013.01); *G02B 21/06* (2013.01); *H01S 5/041* (2013.01); *H01S 5/1042* (2013.01); *H01S 5/18361* (2013.01)

(58) Field of Classification Search
CPC ...... H01S 5/3412; H01S 5/041; H01S 5/1042; H01S 5/18361; H01S 5/0614; H01S 5/183; G02B 21/06
See application file for complete search history.

(56) References Cited

U.S. PATENT DOCUMENTS 5,331,654 A * 7/1994 Jewell ................ H01S 5/18355 372/18
6,711,200 B1 * 3/2004 Scherer ................. G02B 6/122 372/39
(Continued)

FOREIGN PATENT DOCUMENTS

CN 107645123 A * 1/2018
CN 118244553 A * 6/2024 ........... G02B 6/4213
(Continued)

OTHER PUBLICATIONS

US 2025/0093345 A1, 03/2025, Mazed (withdrawn)*
(Continued)

*Primary Examiner* — David A Vanore
(74) *Attorney, Agent, or Firm* — JMB Davis Ben-David

(57) ABSTRACT

The present invention relates to a single photon source, comprising: a microcavity arranged between a concave first minor and a semiconductor heterostructure forming a planar second minor, wherein the microcavity supports an optical mode, a quantum dot embedded in the semiconductor heterostructure and facing the first minor, and a laser light source configured to provide laser light in the microcavity to excite the quantum dot to emit single photons exiting the microcavity.

37 Claims, 15 Drawing Sheets

(51) Int. Cl.

| | |
|---|---|
| ***H01S 5/04*** | (2006.01) |
| ***H01S 5/10*** | (2021.01) |
| ***H01S 5/183*** | (2006.01) |

(56) References Cited

U.S. PATENT DOCUMENTS

| | | | | |
|---|---|---|---|---|
| 6,728,281 | B1 * | 4/2004 | Santori | B82Y 10/00<br>372/45.01 |
| 7,019,333 | B1 * | 3/2006 | Shields | H01S 5/3412<br>257/17 |
| 7,132,676 | B2 * | 11/2006 | Shields | B82Y 20/00<br>257/14 |
| 7,667,995 | B1 * | 2/2010 | Leuenberger | H04B 10/70<br>398/40 |
| 7,778,296 | B1 * | 8/2010 | Vuckovic | H01S 5/10<br>372/41 |
| 7,915,604 | B2 * | 3/2011 | Shields | G02F 1/0126<br>257/E33.069 |
| 8,675,699 | B2 * | 3/2014 | Dantus | G01J 11/00<br>372/25 |
| 9,921,157 | B2 * | 3/2018 | Rothberg | G01N 21/648 |
| 11,309,684 | B2 * | 4/2022 | Lodahl | H01S 5/1042 |
| 2002/0196827 | A1 * | 12/2002 | Shields | H01S 5/10<br>257/14 |
| 2005/0040410 | A1 * | 2/2005 | Ledentsov | H01S 5/183<br>257/94 |
| 2005/0111511 | A1 * | 5/2005 | Assefa | H01S 5/10<br>372/92 |
| 2007/0127531 | A1 * | 6/2007 | Kovsh | B82Y 20/00<br>372/43.01 |
| 2007/0291805 | A1 * | 12/2007 | Ledentsov | H01S 5/18361<br>257/E33.068 |
| 2009/0022491 | A1 * | 1/2009 | Takemoto | H04B 10/70<br>356/318 |
| 2009/0045317 | A1 * | 2/2009 | Fushman | G02B 6/4222<br>385/27 |
| 2010/0142973 | A1 * | 6/2010 | Gubenko | H01S 5/1025<br>372/50.1 |
| 2013/0134309 | A1 * | 5/2013 | Rapaport | H10F 77/40<br>359/332 |
| 2013/0258454 | A1 | 10/2013 | Ding et al. | |
| 2019/0353578 | A1 * | 11/2019 | Polyakov | G01N 15/1459 |
| 2023/0344201 | A1 * | 10/2023 | Warburton | H01S 5/041 |

FOREIGN PATENT DOCUMENTS

| | | | | |
|---|---|---|---|---|
| GB | 2367690 A | * | 4/2002 | H01S 5/34 |
| GB | 2531568 A | * | 4/2016 | H10H 20/824 |
| WO | WO-03001636 A1 | * | 1/2003 | H01S 5/1833 |

OTHER PUBLICATIONS

Wang et al. "Towards optimal single-photon sources from polarized microcavities" Nat. Photonics 13, 770-775 (2019). https://doi.org/10.1038/s41566-019-0494-3.

Song et al "Design of Si/SiO2 micropillar cavities for Purcell-enhanced single photon emission at 1.55 μm from InAs/InP quantum dots" vol. 38, Issue 17, pp. 3241-3244 (2013).

Zhu et al "High efficient single photon source based on photonic molecule with low tunneling strength containing a quantum dot", in Asia Communications and Photonics Conference (ACP) 2018, OSA Technical Digest (Optica Publishing Group, 2018), paper M2I.5.

Najer Daniel et al, "A gated quantum dot strongly coupled to an optical microcavity", Oct. 21, 2019 (Oct. 21, 2019), vol. 575, No. 7784, p. 622-627.

* cited by examiner

SINGLE PHOTON SOURCE FOR GENERATING BRIGHT AND COHERENT SINGLE PHOTONS

CROSS-REFERENCE TO RELATED APPLICATIONS

This is the US National Stage of International Patent Application No. PCT/EP2021/069907 filed Jul. 15, 2021, which claims priority to European Patent Applications EP20186087.1, filed Jul. 15, 2020, and EP20187758.6 filed Jul. 24, 2020.

The present invention relates to a single photon source.

Such a single photon source is a key enabling technology in modern quantum photonics applications—device-independent quantum communication, boson sampling, linear optics-based quantum computing etc. Applications of this kind involve many photons and therefore place stringent requirements on the efficiency of single photon creation: the source must be highly efficient, fast and on-demand; the single photons must be coherent.

The scaling on efficiency is an exponential function of the number of photons. State-of-the-art experiments involve about 20 photons; quantum advantage in boson sampling is predicted for about 50 photons. An increase in efficiency over the state-of-the-art by more than a factor of two, already results in an enormous decrease in run-times, by a factor of $10^6$ for 20 photons. Schemes taking full advantage of quantum superpositions depend very sensitively on the coherence of the photons, i.e. their indistinguishability. It is therefore crucial to maintain the coherence over long strings of photons.

A single emitter can be used as a single photon source. Unlike a cold atom in vacuum, an emitter in the solid-state is naturally trapped in space. Semiconductor quantum dots have large optical dipole moments, very high radiative efficiency and a relatively weak coupling to phonons, advantages over other solid-state emitters. A single quantum dot under resonant excitation at low temperature mimics a two-level system. Photonic engineering on a nano- or micro-scale is required to funnel the photons into one specific mode and to couple the photons from this mode into a single-mode fibre. There are two established techniques. First, in a resonant microcavity, photons are emitted preferentially into the microcavity mode (the Purcell effect), and in an asymmetric microcavity, photon leakage from the microcavity acts as an out-coupler. Much success has been achieved with micropillars (for which the β-factor, the probability of emission into the microcavity mode, is as high as 88%) and with photonic crystal cavities. Secondly, in an on-chip waveguide, photons are emitted preferentially into a laterally-propagating mode and a grating couples the light off the chip. In this case, a β-factor as high as 98% has been demonstrated. However, in both schemes, the end-to-end efficiency, the efficiency as measured in the final optical fibre, is limited by losses and inefficiencies in the out-coupling. The highest end-to-end efficiency reported to date is 24% (H. Wang et. Al., "Towards optimal single-photon sources from polarized microcavities", Nature Photonics 13, 770-775 (2019)).

Based on the above, the problem to be solved by the present invention is to provide a single photon source that comprises an improved end-to-end efficiency and thus allows to reliably generate single photons on-demand, particularly for the above-stated applications.

This problem is solved by a single photon source having the features of claim 1.

Preferred embodiments of the present invention are stated in the sub claims and are described below.

According to claim 1, a single photon source is disclosed, comprising:

- a microcavity arranged between a concave first mirror and a semiconductor heterostructure forming a planar second mirror, wherein the microcavity comprises a stable optical mode,
- a quantum dot embedded in the semiconductor heterostructure and facing the first mirror, and
- a laser light source configured to provide laser light (particularly in the microcavity) to excite the quantum dot to emit single photons exiting the microcavity.

Particularly, according to an embodiment, the single photon source is configured to conduct the laser light to the quantum dot via propagation along an optical axis of the microcavity.

According to an embodiment, the microcavity comprises a first optical mode having a first frequency, particularly resonant frequency, and a second optical mode having a different second frequency. Particularly, in an embodiment, a spectrum of the laser light is broader than the absolute difference between the first and the second optical frequency. Further, in an embodiment, the single photon source is tunable to bring the quantum dot into resonance with the first optical mode or with the second optical mode. Particularly, in an embodiment, the laser light is detuned with respect to both modes.

Particularly, in an embodiment, the stable optical mode is a fundamental optical mode that is split into said first and said second mode.

Furthermore, according to an embodiment, an optical frequency of the first optical mode is larger than an optical frequency of the second optical mode.

According to an embodiment, the single photon source is tunable to bring the quantum dot into resonance with the first optical mode, wherein the laser light is detuned (particularly blue-detuned) with respect to the first and the second optical mode such that a tail of the spectrum of the laser light and a tail of a spectrum of the second optical mode overlap at the optical frequency of the first optical mode. Alternatively, or in addition, the single photon source is tunable to bring the quantum dot into resonance with the second optical mode, wherein the laser light is detuned (particularly red-detuned) with respect to the first and the second optical mode such that a tail of the spectrum of the laser light and a tail of a spectrum of the first optical mode overlap at the optical frequency of the second optical mode.

Furthermore, according to an embodiment of the present invention, the first mode (also denoted as H-polarized mode) comprises a linear polarization and the second mode (also denoted as V-polarized mode) comprises a linear polarization, too, wherein both polarizations are orthogonal with respect to one another. According to a preferred embodiment, the linear polarizations of the first and second optical mode are each aligned with a crystal axis of the semiconductor heterostructure, respectively.

Particularly, this allows the laser light to be coupled into the microcavity via the respective optical mode (first or second optical mode), wherein the single photon emerges from the other optical mode, i.e. in case laser light is coupled into the microcavity via the second optical mode, the single photon emerges from the first optical mode.

Particularly, the above-describe excitation scheme works with high efficiency since the exciton that is excited in the quantum dot comprises a circular-dipole. The circularly-polarized dipole couples to both the linearly- and orthogonally-polarized excitation and collection modes. This scheme can operate with a very high efficiency.

The single photon source according to the present invention still works with other excitons in the quantum dot, however the collection efficiency would be limited for the case of an exciton with linear dipole to the extent of the projection of that linear dipole onto the linear polarization of the collection cavity. This problem can however be remedied using a lateral excitation scheme as will be described further below.

Advantageously, the present invention enables a single photon to be created on-demand in the final optical fibre with a probability of 57%. Furthermore, particularly, the probability of creating more than one photon per pulse is below 0.5%, preferably below 0.2%, preferably below 0.1%.

Furthermore, the coherence of the generated single photons is very high and is maintained over a stream consisting of thousands of photons; the repetition rate is in the GHz regime. Particularly, the present invention breaks with the established semiconductor paradigms, such as micropillars, photonic crystal cavities and waveguides. Instead, preferably gated quantum dots in an open, tunable microcavity are employed. Particularly, the gating ensures low-noise operation, and the tunability compensates for the lack of control in quantum dot position and emission frequency. Furthermore, the output is very well-matched to a single-mode fibre. Surprisingly, an analysis of the present invention shows that the efficiency can be increased up to 80% by eliminating the losses in the macroscopic optical components of the single photon source. Using the same microcavity, but using a lateral-excitation scheme (see for example below) allows increasing the overall end-to-end efficiency up to 87%.

Coherence depends sensitively on the noise in the device. Charge noise results in a fluctuating emission frequency; it may also result in telegraph noise should the charge state of the quantum dot itself fluctuate. However, charge noise is extremely low in gated, high-quality material. In particular, the charge state of the quantum dot can be locked by Coulomb blockade. This not only eliminates telegraph noise associated with a fluctuating quantum dot charge but also allows a single electron (or hole) to be trapped on the quantum dot, facilitating a spin-photon interface.

According to a preferred embodiment, the microcavity is an open microcavity, particularly in the form of a Fabry-Perot type resonator, wherein the microcavity comprises a fundamental mode that is resonant for a given frequency of the laser light at a particular microcavity length. This overall microcavity length is given by the length of an airgap between the semiconductor heterostructure and the first mirror (in the direction of the optical axis or microcavity axis) plus the effective penetration depth within the first mirror plus the effective penetration depth within the semiconductor heterostructure comprising the second (bottom) mirror.

Particularly, this fundamental mode is split into the first mode and the second mode due to a birefringence in the semiconductor heterostructure. Particularly both modes are linearly polarized, with orthogonal polarizations, as indicated above.

The invention is thus based on novel excitation schemes that have not been envisioned before and lead to surprisingly excellent results regarding efficiency of the single photon source. As described above, this excitation scheme based on the first and the second optical mode exploits a small splitting in the microcavity mode resulting in said two optical modes. Particularly, the splitting can arise from a tiny birefringence in the semiconductor heterostructure.

Furthermore, for coupling the laser light into the microcavity and for coupling emitted single photons out of the microcavity (particularly in case said first and second optical mode are used for excitation), the single photon source preferably comprises a microscope, particularly a dark-field microscope. In the case of a lateral excitation, one can eliminate the dark-field aspect of the microscope (and further increase the efficiency, that is slightly reduced on account of losses in the optical elements of the microscope).

According to an embodiment, the microscope comprises a half-wave plate for matching a polarization axis of the laser light incident on the microcavity through the first mirror with the polarization (e.g. V-polarization) of the second mode or with the polarization (e.g. H-polarization) of the first mode.

Furthermore, according to an embodiment, the microscope comprises a final lens arranged in front of an optical output fibre for outputting the respective single photon, wherein the focal length of this final (particularly focusing) lens is chosen to match the NA of the system to the NA of the optical fibre. Particularly, the final lens is aspheric and comprises a focal length of e.g. $f_{fiber}$=11 mm.

According to yet another embodiment of the single photon source, a lateral excitation scheme can be used instead of using the first and second optical mode as described above. Particularly, in an embodiment, the single photon source is configured to conduct the laser light to the quantum dot via an optical mode confined to a surface of the semiconductor heterostructure, Here, the stable optical mode supported by the microcavity is an optical mode that is confined in a direction perpendicular to the surface of the semiconductor heterostructure to a region, particularly layer, below the surface of the semiconductor heterostructure (which surfaces faces the first (e.g. top) mirror), particularly such that the largest electric field amplitude of this optical mode is confined in a region below said surface while part of the electric field can escape to an airgap (evanescently) between the surface of the semiconductor heterostructure and the first (top) mirror.

Particularly, perpendicular to the said surface of the semiconductor heterostructure said the largest amplitude of the mode can be confined in the first few hundreds of nm below the surface. Furthermore, particularly, the laser light source is configured to excite the quantum dot laterally via said optical mode confined to said region. Such a lateral excitation can be accomplished in different ways, which will be described in more detail further below. According to a further embodiment of the present invention, the laser source is configured to provide the laser light in the form of successive laser light pulses, particularly π-pulses. Such pulses can be used with both excitation schemes.

According to a further embodiment of the present invention, the concave mirror comprises a substrate comprising a concave recess formed into a surface of the substrate, which surface faces the semiconductor heterostructure.

Particularly, according to an embodiment, the substrate is a fused-silica substrate. Furthermore, according to an embodiment, the recess is coated with alternating layers of $Ta_2O_5$ and $SiO_2$ terminating with a layer of $Ta_2O_5$.

Preferably, in an embodiment, the recess comprises a sagittal height s in the range from 0.08 μm to 8 μm, preferably in the range from 0.5 μm to 2 μm. In an example the sagittal height is (0.41±0.02) μm. Furthermore, in an embodiment, the recess comprises a radius R of curvature in the range from 1.2 μm to 70 μm, preferably in the range from 5 μm to 20 μm. In the above example, the radius of curvature R amounts to (11.98±0.02) μm.

According to yet another embodiment of the present invention, the semiconductor heterostructure (which may also be denoted a semiconductor chip) comprises a diode into which the quantum dot is embedded, wherein the diode is particularly arranged on the second mirror formed by a distributed Bragg reflector. According to an embodiment, the diode is an NIP diode (also denoted as n-i-p diode).

According to an embodiment, the quantum dot can be an InGaAs quantum dot. Furthermore, the quantum dot can be a GaAs quantum dot.

However, the present microcavity approach does also work for quantum dots emitting at other wavelengths. For example, InAs quantum dots in InP emit at a wavelength around 1550 nm. GaAs quantum dots in AlGaAs emit at 780 nm wavelength.

Particularly, the respective quantum dot can be created during a growth process and is thereby embedded in the semiconductor heterostructure that comprises a distributed Bragg reflector and a diode, particularly NIP diode (see also below). Particularly, an InGaAs quantum dot in GaAs can be created with the Stranski-Krastasnow growth process on GaAs (strain-driven self-assembly). In this case, the distributed Bragg reflector can comprise alternating GaAs and AlAs (or Al0.95Ga0.05As) layers.

Furthermore, a GaAs quantum dot in Al0.3Ga0.7As can be created with droplet epitaxy. In this case, the distributed Bragg reflector can comprise alternating Al0.3Ga0.7As and AlAs (or Al0.95Ga0.05As) layers.

Furthermore, for tuning the single photon source to bring the quantum dot into resonance with the first mode/cavity mode of choice, the single photon source can comprise a positioning device in an embodiment, which positioning device is configured to move the semiconductor heterostructure with respect to the first mirror in order to position the semiconductor heterostructure and therewith the quantum dot with respect to the first mirror.

According to an embodiment, the positioning device rests on a carrier to which the first mirror is connected. Particularly, the carrier can be a titanium cage. Furthermore, the carrier rests on a further positioning device that is configured to move the carrier and therewith the semiconductor heterostructure and the first mirror with respect to an objective of a microscope of the single photon source, which microscope is used to couple the laser light into the microcavity and the emitted single photons out of the microcavity.

Furthermore, according to an embodiment of the present invention, the positioning device is configured to move the semiconductor heterostructure along a microcavity axis z towards and away from the first mirror as well as along a first and a second lateral direction x, y, wherein the first and the second lateral direction x, y are both orthogonal to the cavity axis and particularly orthogonal to one another.

According to a further preferred embodiment of the present invention, a reflectivity of the first mirror is lower than a reflectivity of the second mirror such that the emitted single photon exits the microcavity via the first mirror. Particularly, according to an embodiment, the laser light source is configured such that the laser light enters the microcavity via the first mirror. Alternatively, lateral excitation can be used, wherein laser light enters the microcavity laterally, i.e., perpendicular to the microcavity axis/optical axis.

Particularly, in an embodiment, the reflectivity of the first mirror and the reflectivity of the second mirror are selected such that the cavity loss rate $K_{top}$ attributed to the first mirror is larger than the cavity loss rate $K_{bottom}$ attributed to the second mirror (including unwanted absorptions in the second mirror and particularly also surface scattering losses) by at least a factor of 4, preferably at least a factor of 20, preferably at least a factor of 100, preferably at least a factor of 200, preferably at least a factor of 500, and wherein the total cavity loss rate $K_{total}$ deviates less than 300%, preferably less than 100%, preferably less than 50% from the product 2×g, wherein g corresponds to the atom-cavity coupling.

Furthermore, according to an embodiment, particularly in case the lateral excitation scheme is used, the single photon source comprises an optical fibre, wherein the laser light source is configured to deliver laser light generated by the laser light source to the surface of the semiconductor heterostructure through the optical fibre to excite the quantum dot laterally via said optical mode confined to said region of the semiconductor heterostructure. In an embodiment, the optical fibre comprises an end section extending along a longitudinal axis of the end section of the optical fibre.

In an embodiment, the single photon source comprises an (e.g. patterned) waveguide comprising a ridge, wherein the ridge of the waveguide extends along said longitudinal axis and protrudes from the surface of the semiconductor heterostructure orthogonal to said surface or from a surface of an external coupling unit (see below).

According to a further embodiment, the single photon source comprises a grating configured to redirect the laser light along a direction parallel to the surface of the semiconductor heterostructure.

In an embodiment, the grating is formed on the ridge of the waveguide.

In an alternative embodiment, the grating is formed on the surface of the semiconductor heterostructure.

Particularly in case no grating is involved, the longitudinal axis of the optical fibre preferably extends parallel to the surface of the semiconductor heterostructure (i.e. perpendicular to the optical axis), particularly in plane with the surface of the semiconductor heterostructure. Here, a face side of the end section of the optical fibre faces a lateral surface of the semiconductor heterostructure, particularly an edge of said surface of the semiconductor heterostructure, and particularly the ridge (in case a waveguide is employed) in the direction of the longitudinal axis of the optical fibre, i.e. perpendicular to the optical axis or microcavity axis.

Particularly in case a grating is used, the longitudinal axis extends perpendicular to the surface of the semiconductor heterostructure according to an alternative embodiment, wherein the face side of the end section of the optical fibre faces the grating.

According to a further embodiment, the ridge of the waveguide is formed on the surface of the semiconductor heterostructure, i.e., the face side of the end section of the optical fibre faces the surface of the semiconductor heterostructure either in a direction parallel to the microcavity axis or optical axis (here the grating is formed on the surface of the semiconductor heterostructure or on the ridge of the waveguide) or in a direction parallel to the surface of the semiconductor heterostructure.

According to an alternative embodiment, the single photon source can also comprise an external coupling unit, i.e. a coupling unit separate from the semiconductor heterostructure, wherein here the grating and/or the waveguide comprising the ridge is formed by the external coupling unit that is arranged laterally with respect to the semiconductor heterostructure so that the waveguide particularly extends in plane with the surface of the semiconductor heterostructure.

Particularly, said external coupling unit can be made of another semiconductor or dielectric material optimized for lateral coupling of the laser light into the quantum dot in the semiconductor heterostructure.

Further, in an embodiment, the optical fibre comprises a tapered region of reduced diameter configured to allow an evanescent electromagnetic wave of the laser light to exit the tapered region of the optical fibre to have the evanescent electromagnetic wave coupled to said optical mode confined to the surface of the semiconductor heterostructure.

Further, in an embodiment, the tapered region of the optical fibre extends parallel to the surface of the semiconductor heterostructure.

According to a further embodiment, the tapered region forms a loop or a dimple allowing to bring the tapered region in closer proximity to the surface of the semiconductor heterostructure for coupling the laser light to said optical mode confined to the surface of the semiconductor heterostructure.

According to yet another preferred embodiment of the single photon source, the surface of the semiconductor heterostructure is formed at least in sections by a passivation layer of the semiconductor heterostructure, which passivation layer preferably comprises or is formed out of $Al_2O_3$. The passivation layer can also be formed out of any other suitable material.

According to a further aspect of the present invention, a single photon source is disclosed, the single photon source, comprising:

a microcavity arranged between a concave first mirror and a semiconductor heterostructure forming a planar second mirror, wherein the microcavity supports an optical mode, a quantum dot embedded in the semiconductor heterostructure and facing the first mirror, and a laser light source configured to provide laser light (e.g. in the microcavity) to excite the quantum dot to emit single photons exiting the microcavity; the single photon source being configured to conduct the laser light to the quantum dot via:

(a) propagation along the optical axis of the microcavity, passing through the concave first mirror, wherein the microcavity comprises a first optical mode having a first optical frequency and a second optical mode having a different second optical frequency, wherein the optical frequency of the first optical mode is larger than the optical frequency of the second optical mode, wherein a spectrum of the laser light is broader than the absolute difference between the first and the second optical frequency, and wherein the single photon source is tunable to bring the quantum dot into resonance with the first optical mode or with the second optical mode, wherein the laser light is detuned with respect to the first and the second optical mode; and/or via (b) an optical mode confined to a surface of the semiconductor heterostructure, wherein the surface faces the first mirror in the direction of an optical axis of the single photon source, wherein the laser light source is configured to excite the quantum dot laterally via said optical mode confined to the surface of the semiconductor heterostructure.

This aspect of the present invention can also be combined with features and embodiments of the single photon source as described herein and as stated in the dependent claims.

Yet another aspect of the present invention relates to a method for generating single photons, wherein the method preferably used a single photon source according to the present invention, and comprises the steps of:

exciting a quantum dot embedded in a semiconductor heterostructure to emit single photons by coupling light into a microcavity formed between the semiconductor heterostructure and a concave first mirror, wherein the semiconductor heterostructure comprises a planar second mirror.

According to an embodiment, the light is coupled into the microcavity along an optical axis running perpendicular to the surface of the planar second mirror. Further, in an embodiment, the microcavity comprises a first optical mode having a first optical frequency and a second optical mode having a different second optical frequency. Furthermore, in an embodiment, a spectrum of the laser light is broader than the absolute difference between the first and the second optical frequency. According to a further embodiment, the single photon source is tuned (e.g. by adjusting a position of the semiconductor heterostructure with respect to the first mirror) to bring the quantum dot into resonance with the first optical mode or with the second optical mode, wherein particularly the laser light is detuned with respect to the first and the second optical mode.

Furthermore, according to an embodiment of the method, the optical frequency of the first optical mode is larger than the optical frequency of the second optical mode.

Furthermore, according to an embodiment of the method, the single photon source is tuned (e.g. by adjusting a position of the semiconductor heterostructure with respect to the first mirror) to bring the quantum dot into resonance with the first optical mode, wherein the laser light is blue-detuned with respect to the first and the second optical mode such that a tail of the spectrum of the laser light and a tail of a spectrum of the second optical mode overlap at the optical frequency of the first optical mode; or wherein the single photon source is tuned to bring the quantum dot into resonance with the second optical mode, wherein the laser light is red-detuned with respect to the first and the second optical mode such that a tail of the spectrum of the laser light and a tail of a spectrum of the first optical mode overlap at the optical frequency of the second optical mode. Particularly, the first and the second optical mode each comprise a linear polarization, wherein these two polarizations are orthogonal to one another (see also above).

According to an alternative embodiment of the method, an optical mode of the microcavity is used for exciting the quantum dot, which optical mode is confined to a region below the surface of the semiconductor heterostructure (see also above) that faces the first mirror, wherein the light is sent laterally into the microcavity in a direction running perpendicular to the optical axis/microcavity axis.

According to a further embodiment, prior to the step of exciting the quantum dot, the method further comprises the step of:

Application of a gate voltage across a diode (particularly an NIP diode) comprised by the semiconductor heterostructure to determine a desired charge state of the quantum dot. (The desired charge state corresponds to the voltage at which one can access the desired exciton, particularly the positively charged trion $X^+$ (corresponding to a ground state of one hole and an excited state of two holes and one electron), but one may also work with other excitons such as a neutral exciton $X^0$ (ground state empty quantum dot, excited state one hole, one electron), or the negatively charged trion $X^-$ (ground state one electron, excited state one hole, two electrons).

Furthermore, according to an embodiment, prior to the step of exciting the quantum dot, the method further comprises the step of:

Positioning the second mirror along an optical axis running perpendicular to the second mirror so as to bring an optical mode of the microcavity (e.g. said first or second optical mode) of the microcavity into resonance with a frequency of an optical transition of the quantum dot. (In the case that these first and second optical modes are degenerate, there is effectively only a single optical mode of the microcavity, see also above).

Furthermore, according to an embodiment, prior to the step of exciting the quantum dot, the method further comprises the step of:

Positioning the semiconductor heterostructure in two lateral directions perpendicular to the optical axis to position the quantum dot at an anti-node of the microcavity optical mode. (Particularly, as indicated e.g. in panel B of FIG. 2, one can see that the optical mode of the microcavity has a certain distribution of the electric field, wherein the darker parts in the panel B of FIG. 2 are known as anti-nodes of a standing-wave/field (i.e. where the field is the maximum), wherein the lighter parts are known as nodes of the field).

According to a further embodiment, the method further comprises the step of:

Collection of the emitted single photons escaping through the first mirror with an objective lens and coupling the emitted single photons into a single-mode optical fibre via a lens.

The method according to the present invention can be further characterized by means of the features and embodiments disclosed herein with respect to the single photon source according to the present invention.

In the following, further advantages and features of the present invention as well as embodiments of the present invention are described with reference to the Figures, wherein:

FIG. 1A shows a microcavity of an embodiment of a single photon source according to the present invention, wherein the single photon source comprises a semiconductor heterostructure that comprises a first GaAs/AlAs Bragg mirror and an NIP diode. InGaAs quantum dots are located in the intrinsic region, in tunnel-contact with the Fermi sea in the n-layer. The position of the heterostructure can be adjusted (↔) with respect to the first (top) mirror, a concave mirror in a silica substrate, using an XYZ-nanopositioner. A simulation (points) shows that the output is very close to a Gaussian beam (solid line), wherein the R-squared overlap between the output and a true gaussian is 99.95%;

FIG. 1B shows the calculated conversion efficiency, quantum dot exciton to photon exiting the first mirror, as a function of the microcavity decay rate $\kappa$ for "atom"-photon coupling $g/(2\pi)=4.3$ GHz and atom decay rate $\gamma/(2\pi)=0.30$ GHz. $\eta=\kappa_{top}/(\kappa+\gamma)\cdot\beta$; $\beta=(F_P-1)/F_P$ with $F_P=1+4\ g^2/(\kappa\gamma)$; $\beta$ is indicated with dots and dashed line; $\eta\cdot\beta$ is indicated with squares and dashed line, and $\eta$ is indicated with dots and a solid line;

FIG. 1C shows an excitation scheme according to an embodiment of the present invention, wherein the quantum dot is in resonance with the first optical mode (H-polarised microcavity mode); the laser light is blue-detuned and comprises a polarization (V-polarised) orthogonal to the polarization of the first optical mode. The driving intensity as experienced by the quantum dot is shown.

FIG. 2 shows a semiconductor heterostructure of an embodiment of a single photon source according to the present invention, and a numerical simulation of the microcavity. (A) The semiconductor heterostructure comprises a DBR and an NIP diode structure with embedded self-assembled InGaAs QDs. (B) Numerical simulation of the vacuum electric field $|E_{vac}|$ confined by the microcavity (image to scale). (C) Colour-scale plot: normalised electric field within the $SiO_2$ substrate supporting the first (top) mirror. Contour lines: fit of a Gaussian beam to the calculated normalised electric field. The fit yields a beam waist of $\omega_0=1.05$ μm corresponding to a numerical aperture of NA=0.279. $|E_{max}|$ is the maximum electric field amplitude in this particular domain;

FIG. 3 shows the geometrical characterisation of the curved first mirror. Following $CO_2$-laser machining, the profile of the fabricated recess is measured with a confocal laser scanning microscope. (A) Height map of the recess determined with sub-nm resolution. From the height map, the two principal planes are extracted by fitting a two-dimensional Gaussian function to the data. (B) By evaluating the height information along the two principal axes, it is possible to extract the parameters of the recess such as the radius of curvature R=(11.98±0.02) μm, sagittal height s=(0.41±0.01) μm, and asymmetry of 4.5%;

FIG. 4 shows the single photon flux. (A) Quantum dot (QD1) signal versus z-piezo voltage (microcavity detuning) and bias voltage (quantum dot detuning). The positively charged trion $X^+$ is resonant with the microcavity; the dashed lines denote the boundaries of the Coulomb blockade plateau. (B) Radiative decay rate (following pulsed resonant excitation) versus microcavity detuning for constant bias and constant (x, y)-position. The total Purcell factor $F_P$ is determined to be 11 implying $\beta=93\%$. Via Lorentzian fits, the $\beta$-factor specific to the H-polarised mode is determined: $\beta_H=86\%$. (C) Measured signal versus square root of laser power for zero microcavity-$X^+$ detuning. The laser repetition frequency is 76.3 MHz; the detector has an efficiency of 42±3%. The signal is deliberately attenuated by a factor of 9.9 (right y-axis). The left y-axis shows the expected signal without the attenuation and with a perfect detector. The solid-line is the result of the calculation, describing the response of the quantum dot to the driving field (FIG. 1C);

FIG. 5 shows a dark-field spectroscopy of the microcavity. Signal versus optical frequency expressed as a detuning with respect to the upper-frequency resonance. The microscope operates in dark-field mode with principal axes lying at 45 degrees to the principal axes of the microcavity. The wavelength is $\lambda_0=922$ nm. The fundamental mode splits into two modes both with linear polarisation, one H-polarised, the other V-polarised. The H- and V-axes correspond to the crystal axes of the GaAs wafer. The transmission data (dots) are fitted to a double-Lorentzian function (solid curves) yielding Q-factors for the two polarised modes: $Q_H=11{,}900$ and $Q_V=12{,}800$. The mode-splitting is 34.6 GHz.

FIG. 6 shows an embodiment of the single photon source according to the present invention. The microcavity resides in a cryostat at T=4.2 K. Light is coupled in and out of the microcavity with a polarisation-based dark-field microscope. The objective lens is placed inside the cryostat along with the microcavity; the rest of the microscope is located outside the cryostat. Laser light enters via a single-mode optical fibre and is collimated with an f=11 mm lens, passing through a linear-polariser (LP). The input is reflected by a polarising beam-splitter (PBS); the polarisation axis of the excitation, the V-axis, is set by the half-wave plate ($\lambda/2$). The PBS and a quarter-wave plate ($\lambda/4$) suppress the coupling of unwanted back-reflected laser light into the collection arm.

H-polarised single photons generated by the emitter are transmitted through the PBS and focused into the final single-mode optical fibre.

FIG. 7 shows a quantum-optics characterisation. (A) Autocorrelation $g^{(2)}$ versus delay $\tau$ (QD1). (B), (C) Hong-Ou-Mandel (HOM) experiment (QD1) showing two-photon interference for photons created 1 ns and 1.5 μs apart in time, (B) and (C), respectively.

FIG. 8 HOM setup and the visibility of HOM interference versus time delay between the photons. (A) The optical setup used for HOM measurements. The particular structure of the setup increases the mechanical stability of the interferometer and makes it easy to change the delay between the two photons by changing the fibre delay-loop. (B) V and $V_{raw}$ as a function of the delay between the interfering photons.

FIG. 9 shows the stability of a single photon source according to the present invention. Single photon flux versus time and associated histogram recorded over one hour and over ten hours, A and B, respectively, on quantum dot QD1. Maximum count rates and HOM visibilities recorded on six separate quantum dots, C and D, respectively. The square data points in D correspond to the corrected visibility of the source, V; the circles in D represent $V_{raw}$; and FIG. 10 (A) Calculated photon emission probability of a two-level system driven by filtered optical pulses. The photon emission probability $$\int \kappa \langle \hat{a}_H^{\dagger} \hat{a}_H \rangle dt$$

as a function of the laser detuning, $\Delta_L$, and the excitation power. For this simulation, $\kappa/(2\pi)=25$ GHz and A=32 fs/K. The detuning between the excitation cavity and the TLS is 50 GHz, as indicated by the green dashed line on the colour plot. (B) Photon emission probability as a function of power: the theory (solid line) along with scaled experimental results (dots). The theoretical curve corresponds to the dashed black line in the upper part (A). The dashed line in (B) is the theory calculated with the same parameters except A=0;

FIG. 11 shows a schematical illustration of an embodiment of the single photon source using a lateral excitation scheme, wherein the semiconductor heterostructure supports a near-surface optical mode which propagates in the lateral direction. The quantum dot(s) can be excited by coupling light into this lateral mode in order to implement a so-called "atom drive". Here, an optical fibre is positioned next to the semiconductor heterostructure such that some of the light in the optical fibre couples into the laterally-propagating mode in the semiconductor heterostructure;

Figure 15:
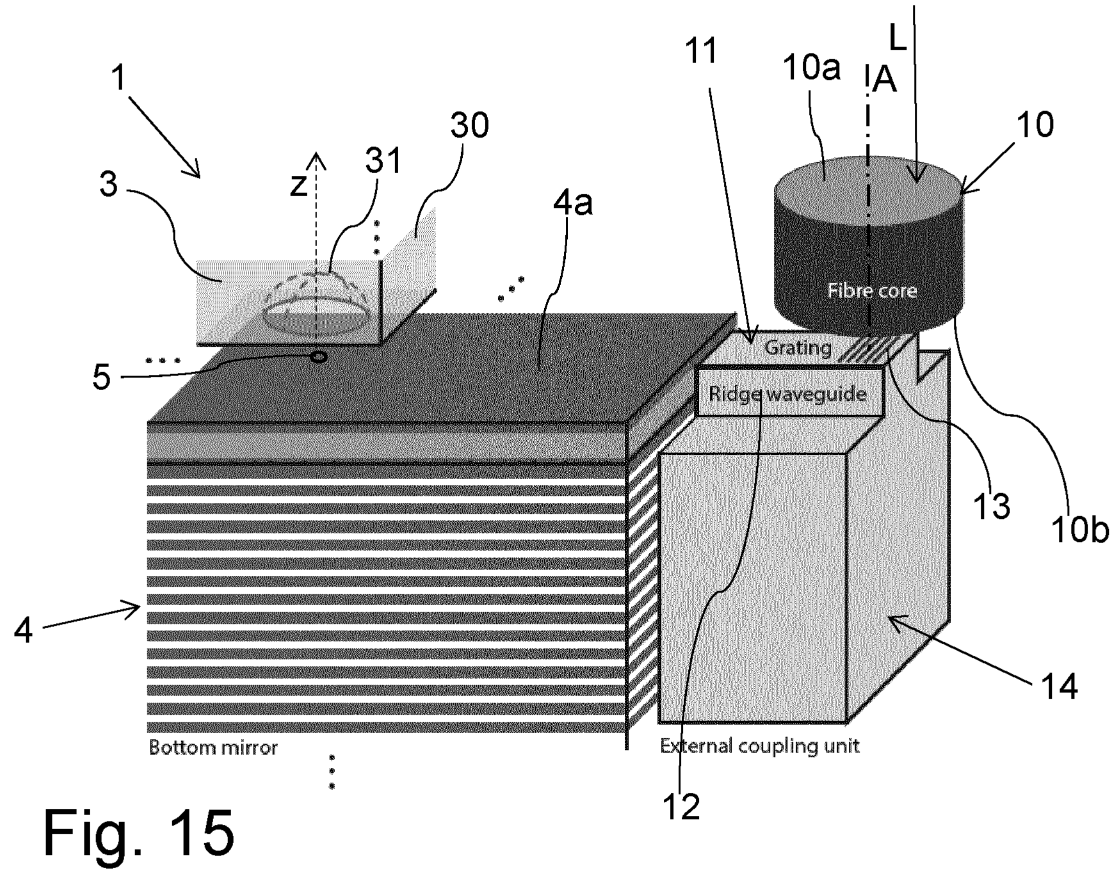
Figure 16:
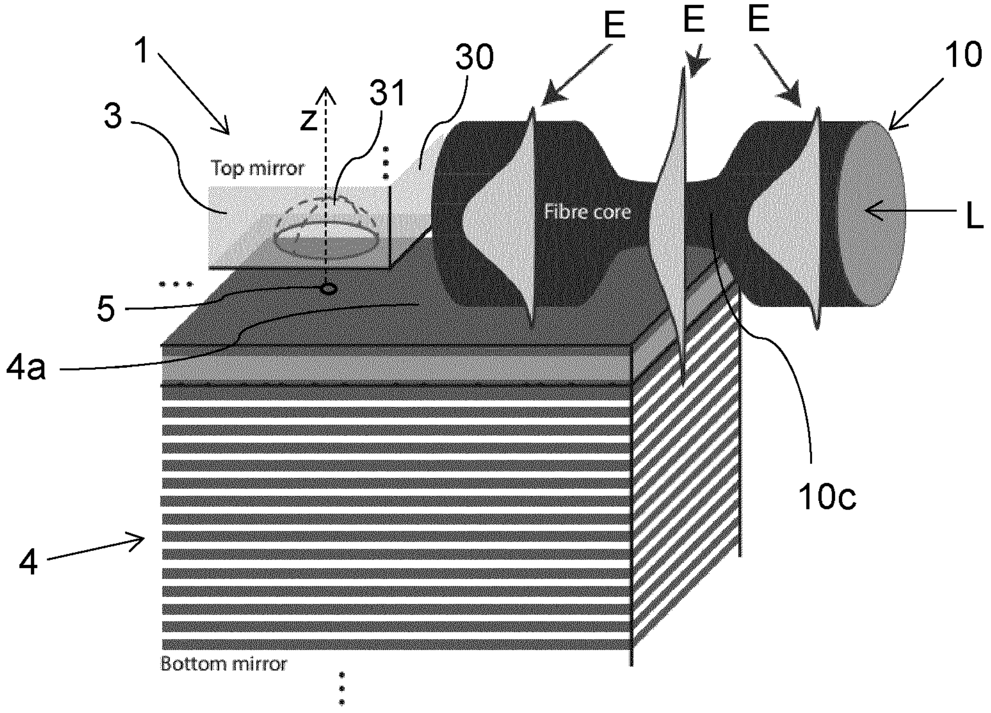
Figure 17:
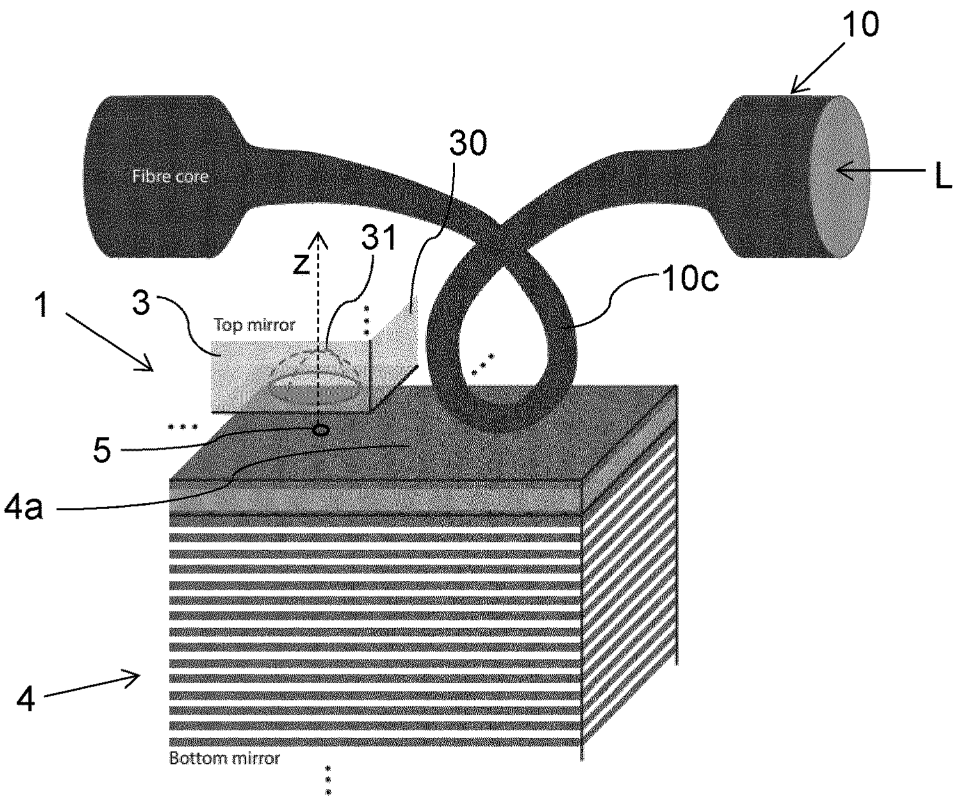

FIG. 15 shows a further embodiment of a single photon source using a lateral excitation scheme, wherein here an external coupling unit comprising a waveguide and a diffraction grating arranged on a ridge of the waveguide is used to couple light into the microcavity in a lateral fashion. Particularly, the external coupling unit can be constructed out of silica or silicon nitride and can be configured to couple light from an optical fibre oriented perpendicular to the surface of the semiconductor heterostructure into, first, the waveguide, and subsequently, into the semiconductor heterostructure;

FIG. 16 shows a further embodiment of a single photon source using a lateral excitation scheme, wherein the optical fibre comprises a tapered portion; and FIG. 17 shows a further embodiment of a single photon source using a lateral excitation scheme, wherein the tapered portion of the optical fibre forms a loop.

Figure 18:
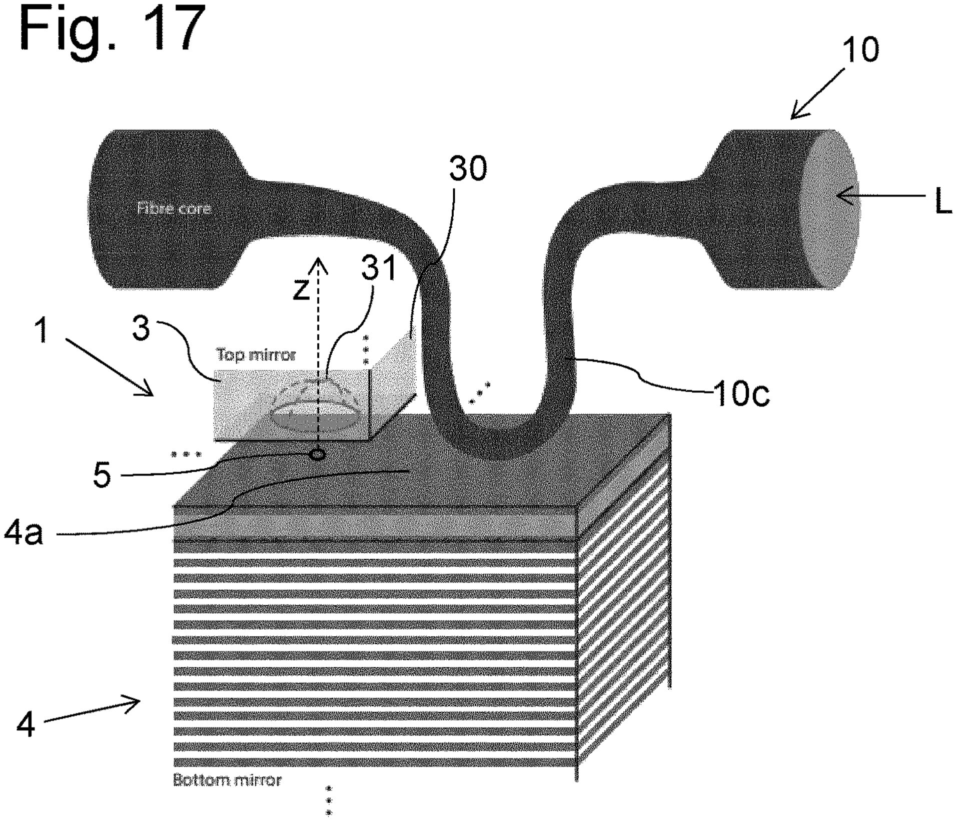

FIG. 18 shows a further embodiment of a single photon source using a lateral excitation scheme, wherein the tapered portion of the optical fibre forms a dimple.

Figure 1A:
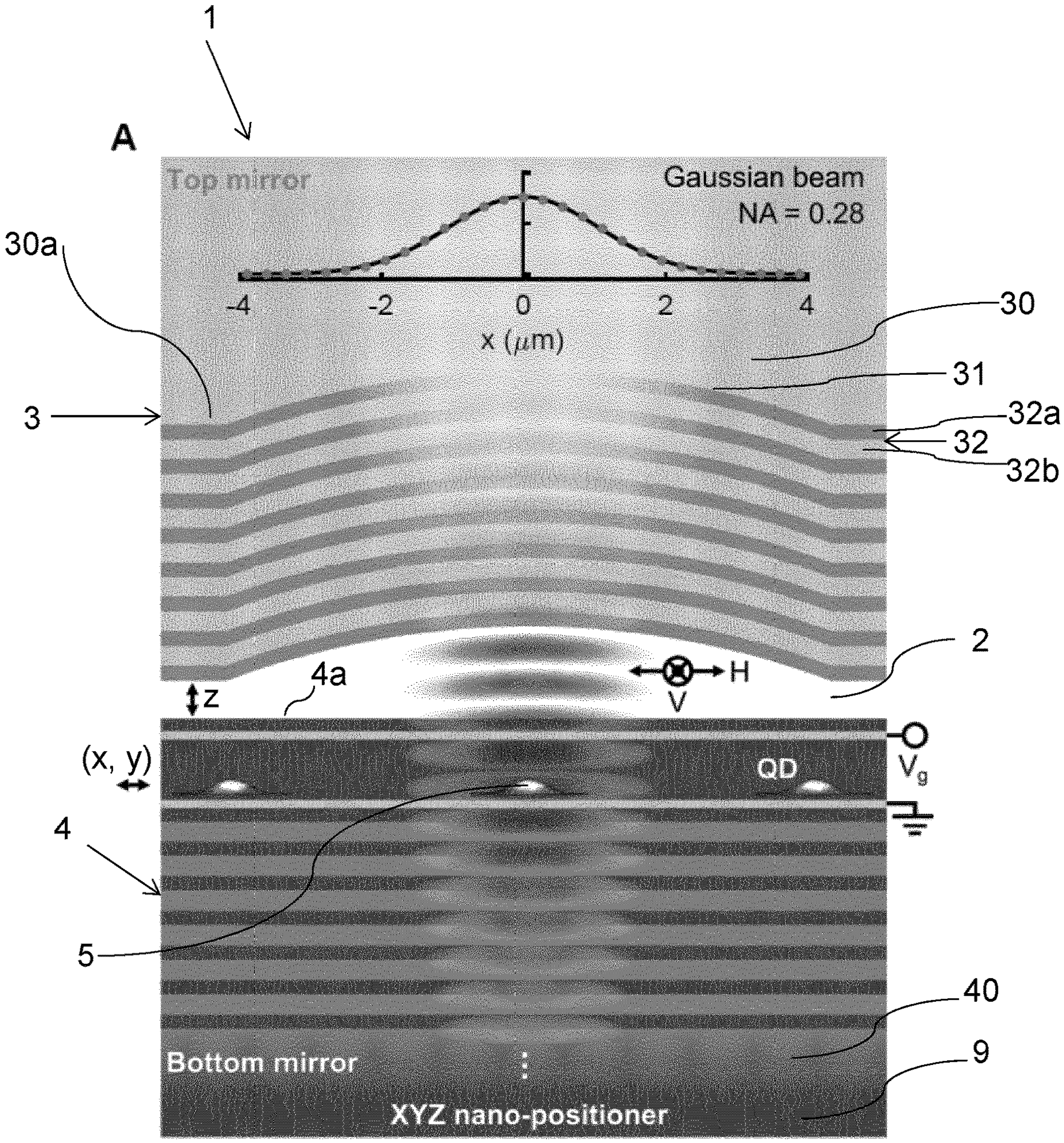

FIG. 1A shows a microcavity 2 of an embodiment of a single photon source 1 according to the present invention.

Figure 10:
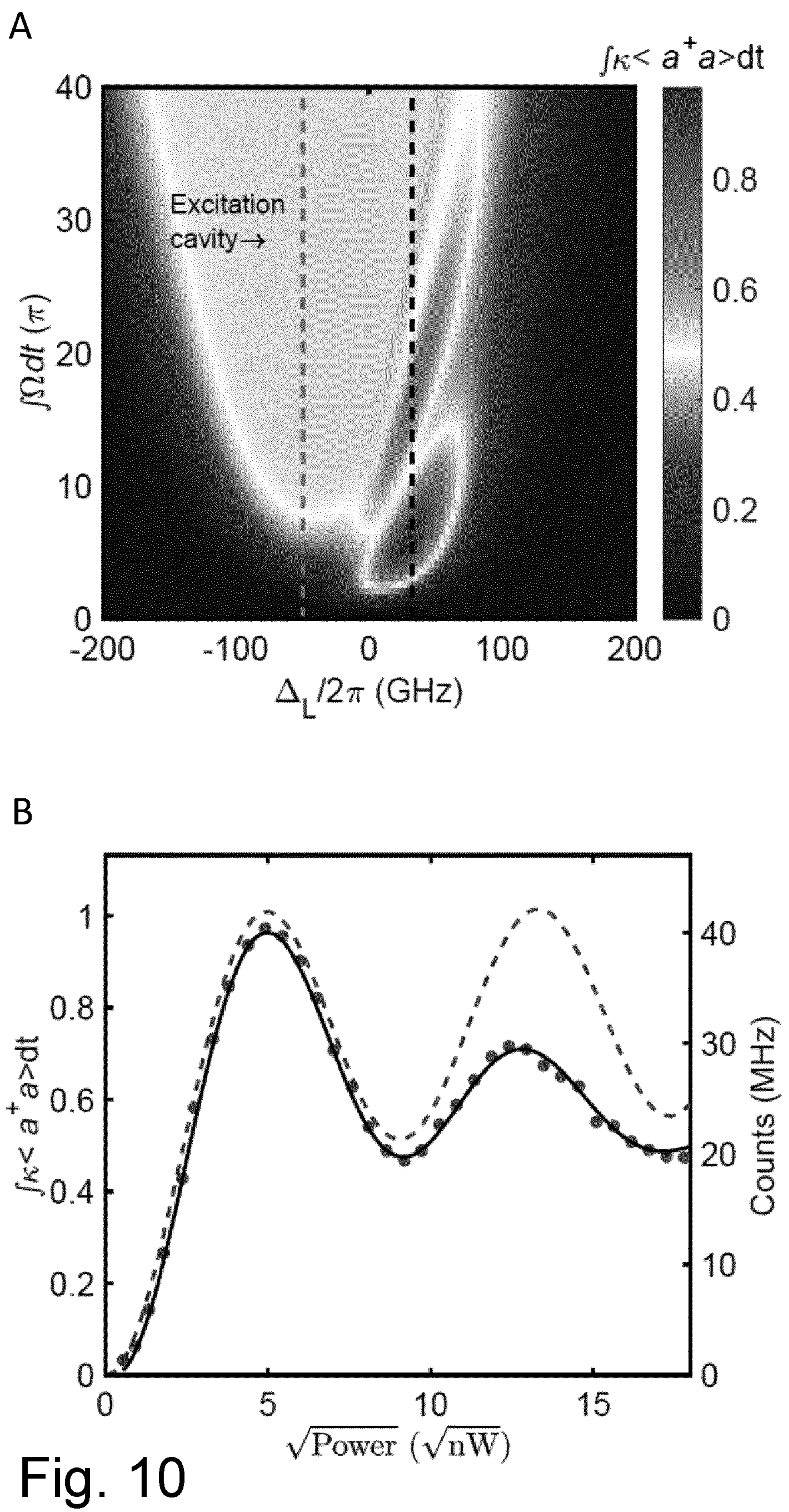

According thereto, the microcavity 2 is arranged between a concave first mirror 3 and a semiconductor heterostructure 4 forming a planar second mirror 40, wherein the microcavity 2 comprises a fundamental optical mode that is resonant for a given laser frequency at a particular microcavity length. This mode splits into a first and a second optical mode H, V having different optical frequencies. Furthermore, at least one quantum dot 5 is embedded in the semiconductor heterostructure 4 and faces the first mirror 3. To excite the at least one quantum dot 5 to emit single photons exiting the microcavity 2, the single photon source 1 further comprises a laser light source 6 configured to provide laser light L in the microcavity 2, wherein, as shown in FIG. 10, a spectrum of the laser light L is broader than the frequency separation between the optical frequencies of the first and second optical mode, wherein the single photon source 1 is tunable to bring the quantum dot 5 into resonance with the first mode H (or alternatively with the second mode V), and wherein the laser light is detuned with respect to both modes H, V such that a tail $t_L$ of the spectrum of the laser light L and a tail $t_V$ of a spectrum of the second mode V overlap at the optical frequency of the first optical mode H.

Particularly, the present invention uses a highly miniaturized Fabry-Perot microcavity (e.g. FIG. 1A), wherein the concave first mirror 3 is preferably micro-machined into a silica substrate 30. Furthermore, particularly, the second mirror 40 is a highly reflective planar mirror that forms part of the semiconductor heterostructure 4.

Particularly, the microcavity 2 is an open microcavity, which means that the microcavity 2 can be tuned and the output is very close to a simple Gaussian mode; it is straightforward to incorporate gates; scattering and absorption losses are extremely small.

Figure 1B:
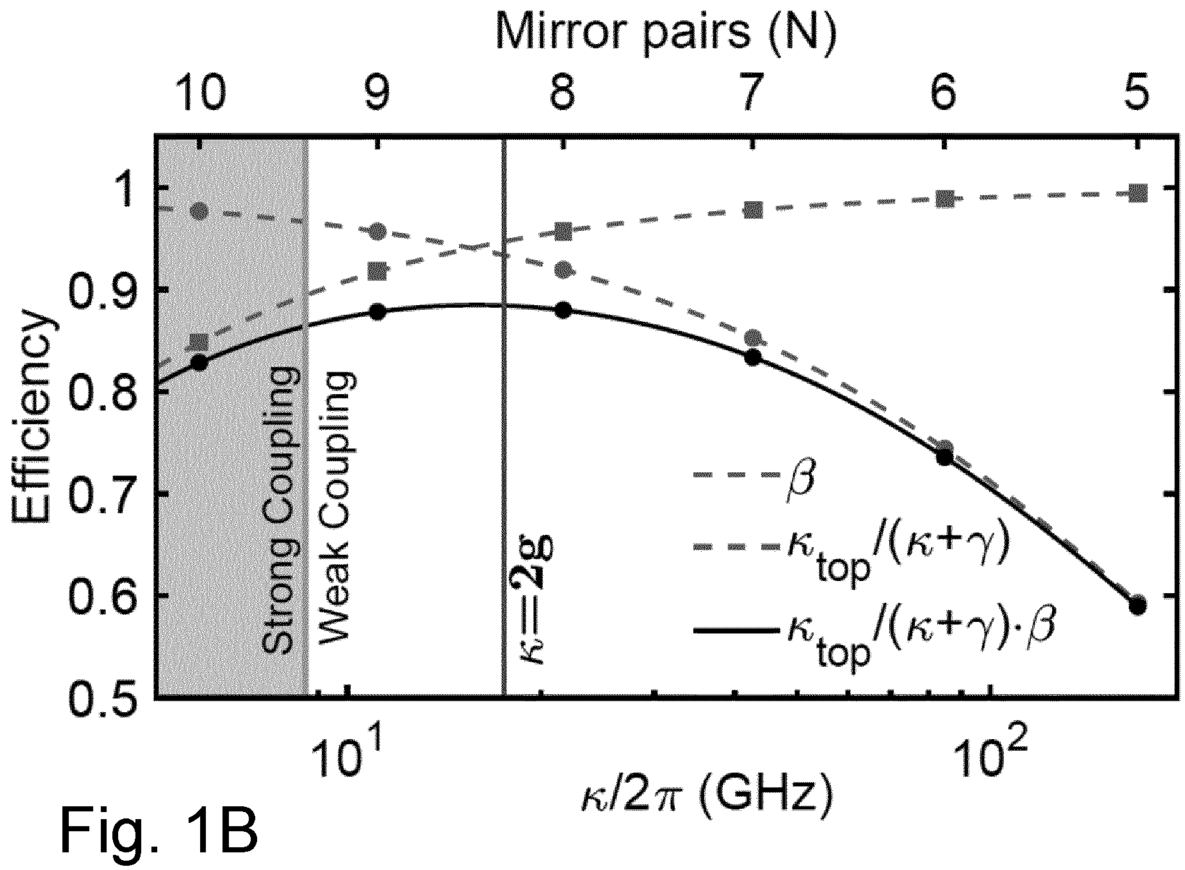

In the generic case (Jaynes-Cummings Hamiltonian with atom-cavity coupling g, cavity loss-rate $\kappa$, atom decay rate into non-cavity modes $\gamma$), one has $\beta=(F_P-1)/F_P$ where the Purcell factor is $F_P=1+4\ g^2/(\kappa\gamma)$. The conversion efficiency of an exciton in the quantum dot 5 to a photon exciting the microcavity is $\eta=\beta\cdot\kappa/(\kappa+\gamma)$. For fixed g and $\gamma$, $\eta$ can be maximized by choosing $\kappa=2$ g, as indicated in FIG. 1B. Taking a quantum dot with transform-limited linewidth $$\left(\frac{\gamma}{2\pi} = 0.29\ \text{GHz}\right)$$

in a microcavity $$\left(\frac{\gamma}{2\pi} = 4.4\ \text{GHz}\right),$$

the condition $\kappa$=2 g implies an efficiency $\eta$ as high as 94%. In other words, ideal behaviour results in high efficiency single photon generation.

Figure 2:
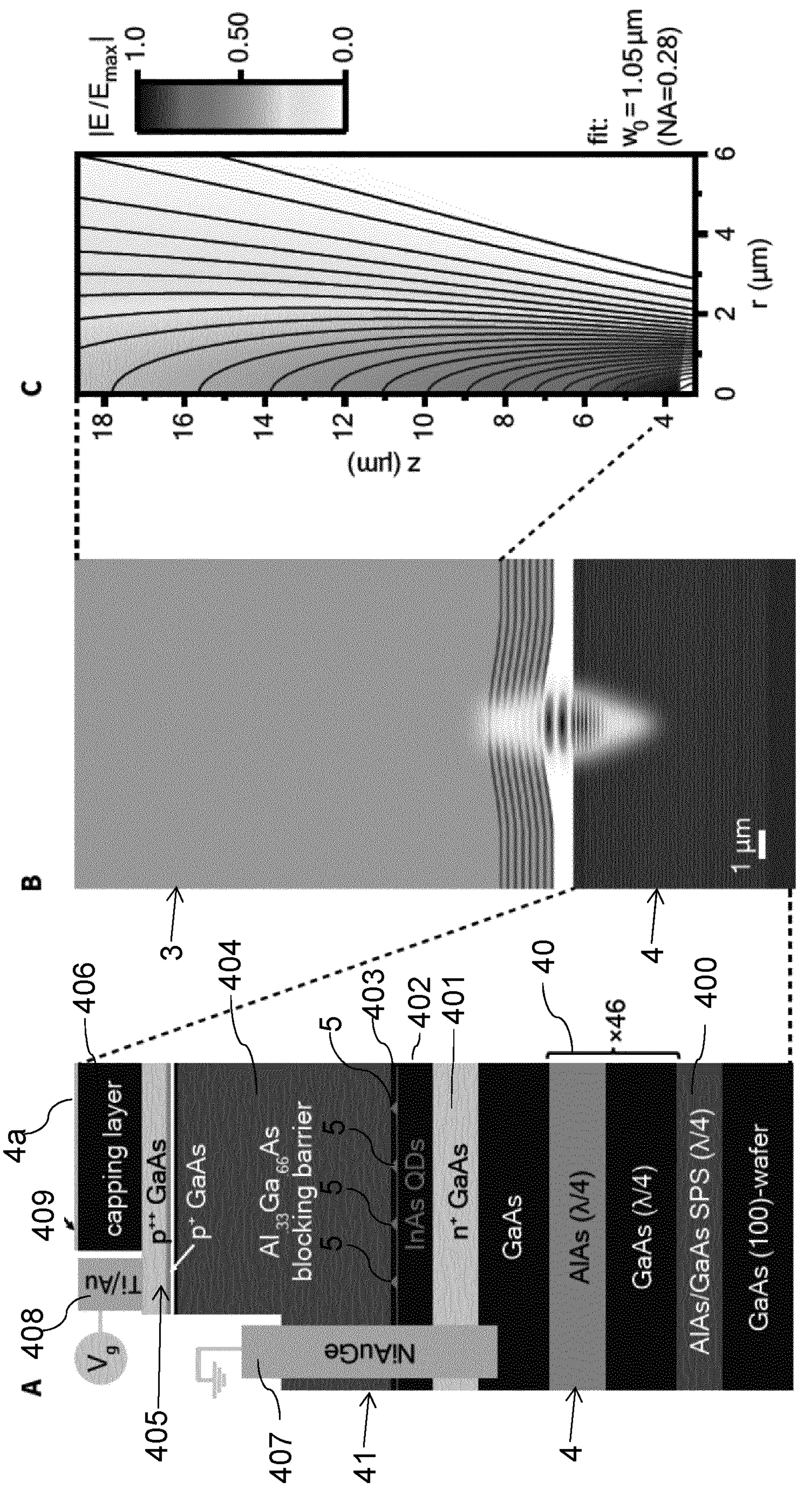

According to a preferred embodiment, as shown in FIG. 2, the heterostructure 4 is grown by molecular beam epitaxy (MBE) and consists of a diode 41, particularly an NIP diode 41, with e.g. at least one or several embedded self-assembled InGaAs quantum dots (QDs) 5. This design allows for QD frequency tuning via the DC Stark effect as well as QD charging via Coulomb blockade. The NIP diode 41 is grown on top of a semiconductor distributed Bragg reflector (DBR) that forms a planar second (e.g. bottom) mirror 40, preferably composed of 46 pairs of AlAs (80.6 nm thick)/GaAs (67.9 nm thick) quarter-wave layers (QWLs) with a centre wavelength of nominally 940 nm (measured: 917 nm). Below the DBR 40, an AlAs/GaAs short-period superlattice (SPS) 400 preferably composed of 18 periods of 2.0 nm AlAs and 2.0 nm GaAs is grown for stress-relief and surface-smoothing.

From bottom to top (see panel A of FIG. 2), the NIP diode 41 consists of an n-contact 401, 41.0 nm Si-doped GaAs, $n^+$, doping concentration $2 \cdot 10^{18}$ $cm^{-3}$. A 25.0 nm layer 402 of undoped GaAs acts as a tunnel barrier 402 between the n-contact 401 and the respective Quantum dot (QD) 5.

Particularly, the respective self-assembled InGaAs QD 5 is e.g. grown by the Stranski-Krastanov process and the QD emission is blue-shifted via a flushing-step. The respective QD 5 is capped by an 8.0 nm layer 403 of GaAs. A blocking barrier 404, 190.4 nm of $Al_{0.33}Ga_{0.67}As$, reduces current flowing across the NIP diode 41 in forward-bias. The p-contact 405 consists of 5.0 nm of C-doped GaAs, $p^+$ (doping concentration $2 \cdot 10^{18}$ $cm^{-3}$) followed by 20.0 nm of $p^{++}$-GaAs (doping concentration $1 \cdot 10^{19}$ $cm^{-3}$). Finally, there is a 54.6 nm-thick GaAs capping layer 406. Particularly, the layer thicknesses are preferably chosen to position the respective QD 5 at an antinode of the vacuum electric field. The p-contact 405 is centered around a node of the vacuum electric field to minimize free-carrier absorption in the p-doped GaAs. Coulomb blockade is established on times comparable to the radiative decay time for GaAs tunnel barriers typically ≤40 nm thick. This is less than the thickness of a QWL thereby preventing the n-contact 401 being positioned likewise at a node of the vacuum electric field. However, at a photon energy 200 meV below the bandgap, the free-carrier absorption of $n^+$-GaAs ($\alpha \approx 10$ $cm^{-1}$) is almost an order-of-magnitude smaller than that of $p^{++}$-GaAs ($\alpha \approx 70$ $cm^{-1}$). The weak free-carrier absorption of $n^+$-GaAs is exploited in the design presented here by using a standard 25 nm thick tunnel barrier. The n-contact 401 is positioned close to a vacuum field node although not centered around the node itself.

After growth, individual 3.0×2.5 $mm^2$ pieces are cleaved from the wafer. The QD density increases from zero to $\sim 10^{10}$ $cm^{-2}$ in a roughly centimetre-wide stripe across the wafer. The sample used in the examples/experiments presented here was taken from this stripe. Its QD density, measured by photoluminescence imaging, is approximately $7 \cdot 10^6$ $cm^{-2}$. Separate ohmic contacts 407, 408 are made to the $p^{++}$ and $n^+$ layers. For the n-contact 401, the capping layer 406, the p-doped layers 405 and part of the blocking barrier 404 are removed by a local etch in citric acid. On the new surface, NiAuGe is deposited by electron-beam physical vapour deposition (EBPVD). Low-resistance contacts 408 form on thermal annealing. To contact the p-doped layer 405, the capping layer 406 is removed by another local etch. On the new surface, a Ti/Au contact pad 408 (100 nm thick) is deposited by EBPVD. Although this contact 408 is not thermally annealed it provides a reasonably low-resistance contact to the top-gate on account of the very high p-doping (cf. panel A of FIG. 2). After fabricating the contacts 407, 408 to the n- and p-layers 401, 405, the contacts 407, 408 are covered with photoresist and a passivation layer 409 is deposited onto the surface 4*a* of the semiconductor heterostructure 4 (also denoted as sample). A thin native oxide layer on the surface is removed by etching a few nm of GaAs in HCl. Following a rinse in deionised water, the sample 4 is immersed in a bath of ammonium sulphide ($(NH_4)_2S$). Subsequently, the sample 4 is transferred rapidly into the chamber of an atomic-layer deposition (ALD) setup. An 8 nm layer 409 of $Al_2O_3$ is deposited using ALD at a temperature of 150 °C With the present heterostructure 4, this process is beneficial regarding reduction of surface-related absorption, since it allows to achieving a low-loss microcavity. An advantage of the surface passivation lies in the fact that it prevents the native oxide of GaAs from reforming after its removal: it provides a stable termination to the GaAs heterostructure 4. Following the surface-passivation procedure and photoresist stripping, the NiAuGe and Ti/Au films 407, 408 are wire-bonded to large Au pads on a sample holder. Using silver paint, macroscopic wires (twisted pairs) are connected to the Au pads.

Figure 3:
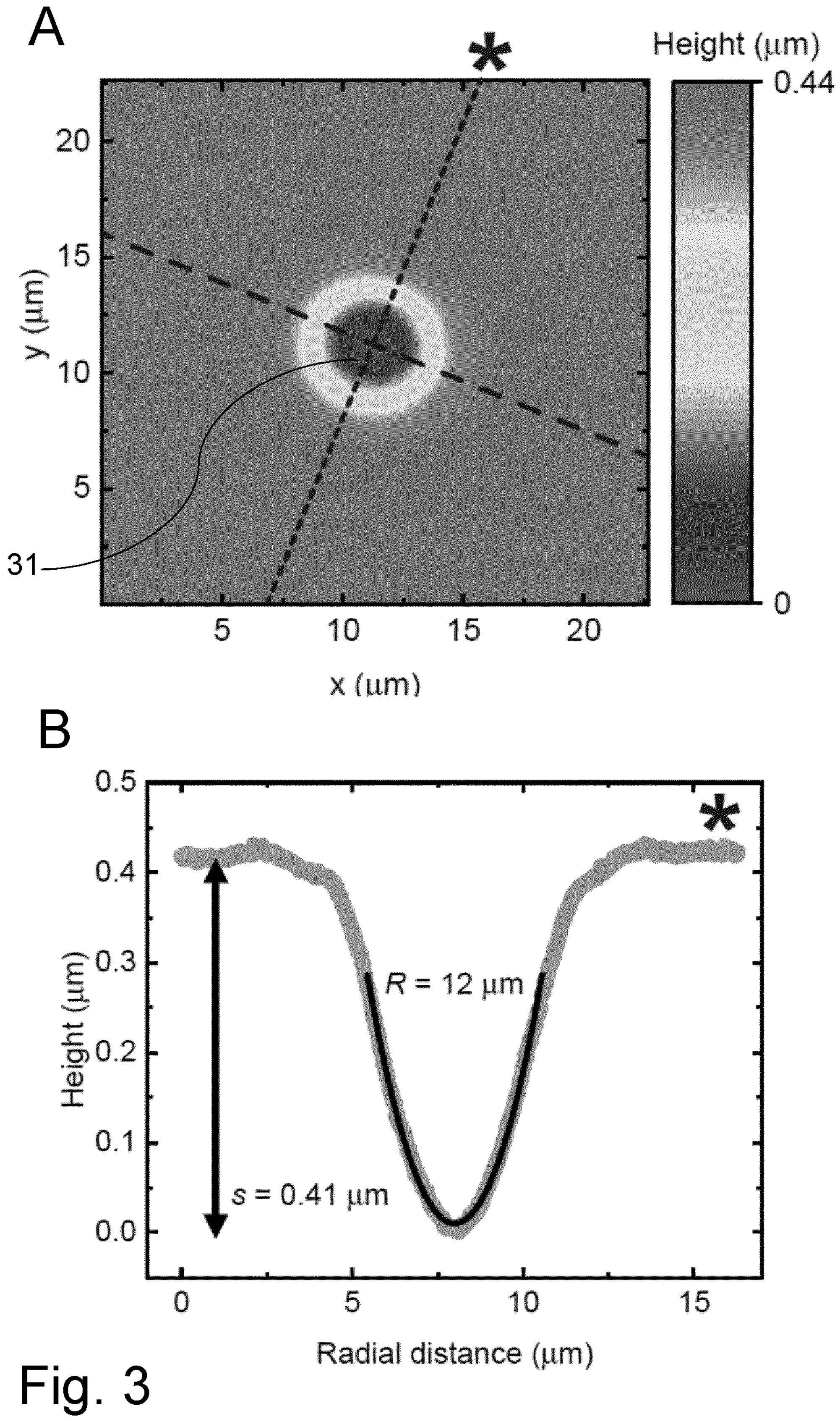

According to a preferred embodiment the first (e.g. top) mirror 3 is fabricated in a 0.5 mm thick fused-silica substrate 30. An atomically-smooth recess 31 is machined at the silica surface 30*a* via $CO_2$-laser ablation, wherein particularly a focusing lens is used in the ablation setup with NA=0.67. The profile of the fabricated recess 31 (also denoted as crater) is measured by a confocal laser scanning microscope (Keyence Corporation), as shown in the upper panel A of FIG. 3. From the two-dimensional height profile, two principal axes can be identified, and the profile parameters can be extracted (cf. lower panel B of FIG. 3). In the example at hand, the radius of curvature of this recess is R=(11.98±0.02) μm and the sagittal height amounts to s=(0.41±0.02) μm. Furthermore, after laser ablation, the recess 31 is preferably coated with 7 QWL-pairs 32 of $Ta_2O_5$ (refractive index n=2:09 at $\lambda_0$=920 nm) and $SiO_2$ (n=1.48 at $\lambda_0$=920 nm) layers 32*a*, 32*b* terminating with a QWL 32*a* of $Ta_2O_5$ by ion-beam sputtering at a commercial company (Laseroptik GmbH), see FIG. 1A and panel B of FIG. 2.

Quantum dots 5 embedded in a semiconductor heterostructure 4 of the afore-described kind exhibit close-to-transform-limited linewidths. With a highly reflective first mirror, the microcavity 2 has Q-factors up to $10^6$ and the strong coupling regime of cavity-QED can be reached. This allows a precise measurement of the coupling $$\left(\frac{g}{2\pi} = 4.0\ \text{GHz}\right)$$

and an estimation of the residual losses in the semiconductor (373 ppm per round-trip). According to an embodiment, a modest reflectivity first mirror (transmission 10,300 ppm per round-trip according to the design) is used such that $\kappa \approx \kappa_{top} \gg \kappa_{bottom}$ and $\kappa \approx 2$ g (cf. FIG. 1B). The measured Q-factor is 12,600, matching the value expected from the design of the first and the second mirror.

Furthermore, for comparison with measurements of the Q-factor, the microcavity Q-factor can be calculated using a one-dimensional transfer matrix simulation (The Essential Macleod, Thin Film Center Inc.), wherein the first (e.g. top) mirror is described using the design parameters taking the manufacturer's values for the refractive index (mirror design: silica-$(HL)^7H$ with H(L) a quarter-wave layer in the high- (low-) index material at wavelength 920 nm, refractive indices 2.09 (1.48)). The transmission loss per round trip of the first mirror is 10,300 ppm. The second (e.g. bottom) mirror has a nominal design GaAs-$(HL)^{46}$-active layer with H (L) a quarter-wave layer in GaAs (AlAs) at wavelength 940 nm, as shown in panel A of FIG. 2. In practice, the layers become gradually thinner during growth. The wavelength of the stopband and the oscillations in reflectivity out with the stopband can be very well described by postulating a linear change in thickness during growth. The losses in the entire semiconductor heterostructure (including the free-carrier absorption in active layer) can be assessed by measuring the Q-factors with an extremely reflective, extremely low-loss top mirror: the transmission loss is just 1 ppm per round trip; the absorption/scattering losses amount to 373 ppm per round-trip. These losses are negligible compared to the transmission loss of the first mirror. The simulated Q-factor for the semiconductor DBR—GaAs active layer (6 QWLs)—air-gap (4 QWLs)—first (top) mirror structure is 14,000. This is very close to the measured value, 12,600, taking here an average over the positions of the 6 QDs evaluated in the example at hand, and averaging over the two optical microcavity modes described herein.

Furthermore, in order to estimate the QD-microcavity coupling, a finite-elements method (Wave-Optics Module of COMSOL Multiphysics) is used to compute the vacuum electric field amplitude $|E_{vac}(r, z)|$ confined by the micro-cavity (cf. FIG. 1A, panel B of FIG. 2). The model assumes axial symmetry about the optical axis ((x, y)=0). Particularly, a 1 μm thick perfectly index-matched layer at all outer boundaries of the simulation is used to prevent internal reflections. The model takes a first mirror with radius of curvature R=11.98 μm and sagittal height s=0.41 μm, exactly the mirror used in the examples of the present invention (see also above). This model also allows the Q-factor to be determined, yielding Q=14,000, in agreement with the one-dimensional transfer matrix calculation. Q=14,000 corresponds to $\kappa/(2\pi)$=23.3 GHz where K is the decay rate of the microcavity.

At the location of the QDs ($z=z_{QD}$) in the exact anti-node of the microcavity mode (r =0), the field is $|E_{vac}(0, z_{QD})|$=35,000 V/m. A QD at these wavelengths (920 nm) has an optical dipole of μ/e=0.71 nm, where e is the elementary charge. The $X^+$ consists of two degenerate circularly-polarised dipole transitions (at zero magnetic field). We consider the interaction of one of these circularly-polarised dipoles with a linearly-polarised microcavity mode. The predicted QD-cavity coupling is therefore $$\hbar g = \mu \cdot E_{vac}(0, z_{QD}) / \sqrt{2} \text{ giving } \frac{g}{2\pi} = 4.24 \text{ GHz}.$$

This dipole moment implies a natural radiative decay rate of 1.72 $ns^{-1}$, equivalently $$\frac{\gamma}{2\pi} = 0.27 \text{ GHz}$$

(assuming the dipole approximation in an unstructured medium). The calculated Purcell factor is therefore $$F_P = 1 + \frac{4g^2}{\kappa\gamma} = 12.3.$$

The Purcell factor and coupling g can be determined from the experiment. Focusing on one of the quantum dots, here denoted as QD1, the natural radiative decay rate can be determined by gradually tuning the microcavity out of resonance with the selected QD, extrapolating the decay rate to large detunings (cf. e.g. panel B of FIG. 4). This gives $$\frac{\gamma}{2\pi} = 0.30 \text{ GHz}.$$

This agrees well with the estimate above. On resonance, the total decay rate increases to 3.33 GHz. In the experiment however, the polarization-degeneracy of the microcavity is lifted (see above) and the QD exciton, an $X^+$, interacts with both microcavity modes.

Figure 4:
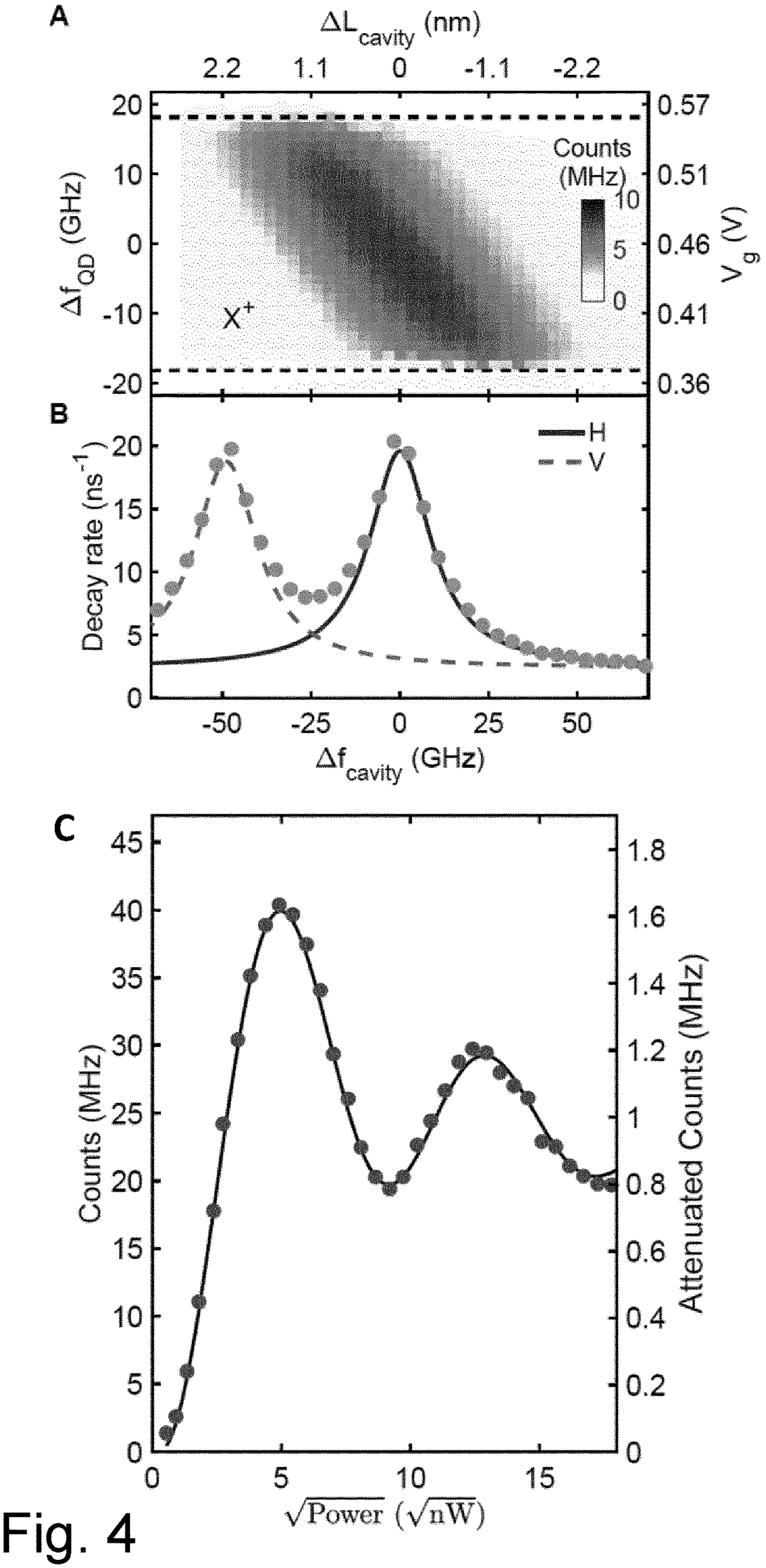

Here, we focus on the resonance with the H-polarised mode, wherein the contribution to the total decay rate can be determined from the presence of the V-polarised microcavity mode by fitting the total decay rate as a function of microcavity detuning to two Lorentzians (cf. panel B of FIG. 4). Subtracting the contribution from the V-polarised mode at the resonance with the H-polarised mode, a decay rate of $$\frac{\gamma_H}{2\pi} = 3.13 \text{ GHz}$$

is obtained. This is the decay rate one would expect if the V-polarised mode were highly detuned, in other words if the microcavity mode-splitting were very large. This limit, a circularly-polarised dipole interacting with a single linearly-polarised microcavity mode, allows a comparison to be made with the calculated properties of the microcavity. The Purcell factor arising from the H-polarised mode alone is therefore $$F_P^H = \gamma_H/\gamma = 10.4,$$

close to the calculated value (12.3). Using $$F_P^H = 1 + 4g^2/(\gamma\kappa)$$

and taking $\kappa/(2\pi)$=24.0 GHz, the experimental value for the H-polarised mode (wavelength 919 nm, Q=13.600) amounts to $g/(2\pi)$=4.1 GHz. This is close to the calculated value (4.24 GHz). (Exact agreement is not expected as the QD dipole fluctuates from QD to QD.) However, one can conclude that, first, the vacuum field in the real microcavity is compatible with the value calculated from the microcavity's geometry;

and second, that the lateral tuning of the microcavity enables the QD to be positioned at the anti-node of the vacuum field.

Furthermore, a simulation of the microcavity mode was used to determine the parameters of the output beam of the microcavity, notably the beam waist. The calculated beam in the $SiO_2$ substrate, i.e. in the region above the first (top) mirror (cf. panel C of FIG. 2), is fitted to a Gaussian beam of the form $$|E(r,z)| = |E_0|\frac{w_0}{w(z)}e^{-r^2/w^2(z)}$$

with waist radius at z given by $$w^2(z) = w_0^2\left(1+\left(\frac{z}{z_R}\right)^2\right)$$

$$z_R = n\pi w_0^2/\lambda_0$$

is the Rayleigh range in the medium (refractive index n=1.4761 is taken for $SiO_2$). The fit taking $\omega_0$ (and $|E_0|$) as fit parameters results in $\omega_0$=1.05 μm.

This corresponds to a simulated numerical aperture of NA=$\lambda_0/(\pi\omega_0)$=0.279 for the specific microcavity at hand. However, particularly, the main concept is to match the optical elements to the NA of the microcavity-setup in order to maximize collection efficiency.

Due to the achievable Q-factors (see above), the residual losses in the semiconductor are negligible. The semiconductor heterostructure 4 contains thin n- and p-type layers with the quantum dot(s) 5 in tunnel contact with the electron Fermi sea in the n-type layer such that Coulomb blockade is established (see above). It is straightforward to make contacts to the n- and p-type layers even in the full microcavity structure 2. The chip, i.e. the semiconductor heterostructure 4 comprising the quantum dot(s) 5 and the second mirror 40, is preferably positioned relative to the first mirror 3 in situ (cf. FIG. 1A): this tunability is exploited to ensure a match between a particular quantum dot and the microcavity mode, both in frequency and lateral position.

A challenge in all optically-driven quantum dot single photon sources is to separate the single photon output from the driving laser light. A standard scheme is to excite and detect in a cross-polarised configuration. Applied to a charged exciton for which the transitions are circularly polarised, this scheme leads to a 50% loss in the collection efficiency. In the framework of the present invention, this loss is avoided by utilizing the positively-charged exciton, X. The fundamental optical microcavity mode splits into the two (first and second) optical modes, H- and V-polarised, separated by for example by 50 GHz, on account of a small birefringence.

Figure 5:
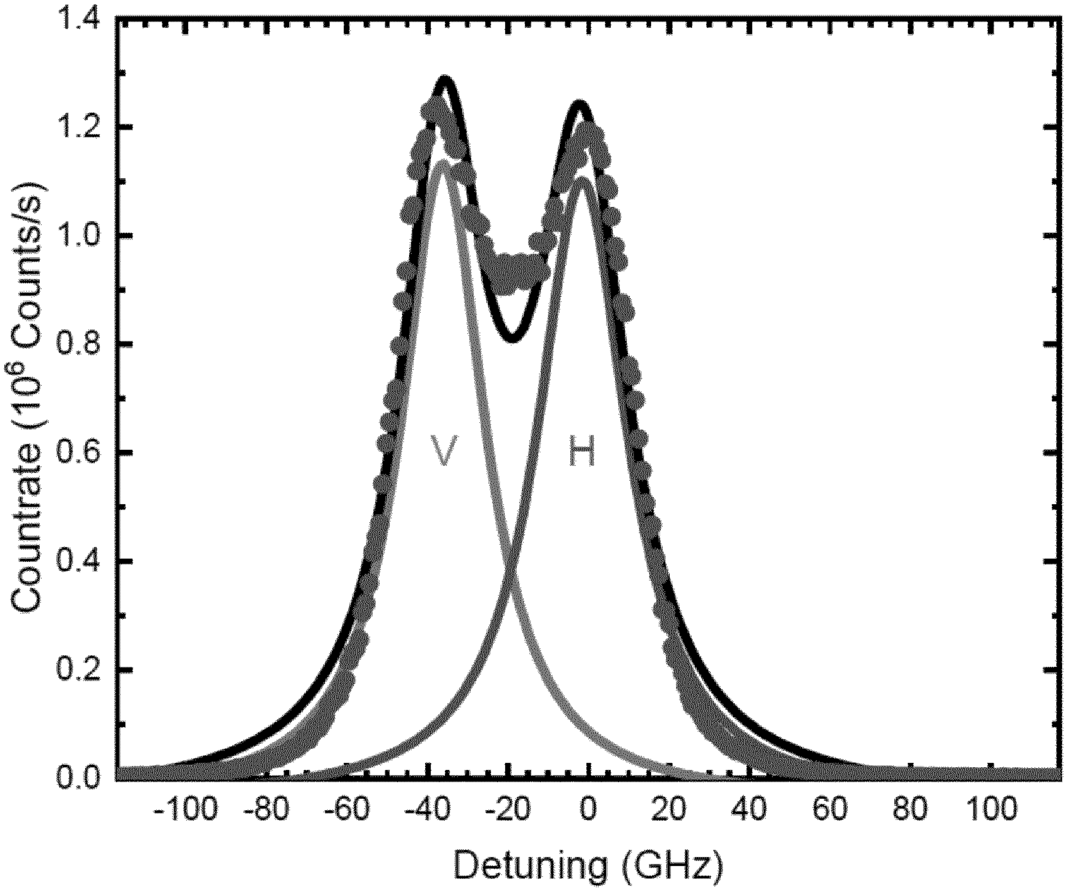

Particularly, in order to determine the Q-factor of the microcavity, a dark-field measurement can be performed, as shown in FIG. 5. Given the spectral tunability of the microcavity, its Q-factor can be determined for a wide wavelength range within the stopband of the mirrors, centered around $\lambda_0$=919 nm.

FIG. 5 shows such a measurement performed on a fundamental mode at $\lambda_0$=922 nm. The fundamental mode splits into two modes, each linearly polarised, with opposite polarisations, H and V. The mode-splitting is 34.6 GHz in FIG. 5. The H and V axes, i.e. the linear polarizations of the first and second optical mode H, V, align with the crystal axes of the semiconductor heterostructure 4.

Particularly, in an embodiment, the semiconductor heterostructure is grown on a crystal in which the z-axis (vertical axis, same as the optical axis) is the [001] axis of the crystal. This also means that the crystal orientation of the substrate/wafer defines the crystal orientation of all the layers above. In the present example, the semiconductor heterostructure is cleaved along [110] and [110] crystalline axes. These are orthogonal to one another, and orthogonal to [001] (z). When cleaving crystals, the cleaving lines tend to follow the crystalline axes.

This points to the physical origin of the mode-splitting: a small birefringence in the semiconductor heterostructure 4. The birefringence is probably induced by a very small uniaxial strain. The splitting of the fundamental optical microcavity mode into two separate optical modes H, V together with the linear, orthogonal polarisations of these two optical modes H, V are exploited in the present invention to achieve high efficiencies which will be discussed in more detail further below. The mode-splitting (frequency separation) therefore is an important parameter. Performing this measurement at different locations on the sample yields similar values of Q-factors but a spread in mode-splittings. For the quantum dots investigated, denoted QD1 to QD6 herein, the splitting lies between 34.6 (QD6) and 50 GHz (QD1). The Q-factors of both H- and V-polarised modes are extracted from the dark-field spectrum (solid curves in FIG. 5) yielding $Q_H$=11,900 and $Q_V$=12,800. The finesse is F=506±13. F was determined by microcavity scanning at a wavelength of 922 nm, the same wavelength used for the determination of the Q-factors. Unlike the mode-splitting, the Q-factors are the same at different locations on the sample.

Particularly, the microcavity 2 does not have a monolithic design and is potentially susceptible to environmental noise, vibrations and acoustic noise. The microcavity 2 is preferably operated in a helium bath-cryostat 15, wherein the cryostat 15 (cf. FIG. 6) is preferably shielded from vibrational noise by an active damping stage and from air-borne acoustic noise by an acoustic enclosure. Using the microcavity 2 itself as a noise sensor shows that environmental noise is significant only when operating with a finesse above 10,000, corresponding to a Q-factor of approximately $10^5$ with the present design. Here, according to an embodiment, the Q-factor is approximately $10^4$ so that the single photon source is not troubled by residual environmental noise.

According to the present invention, the mode splitting of the fundamental microcavity mode plays a pivotal role in one of the two excitation schemes used to generate single photons.

To this end, the spectrum of the laser pulses used to excite the respective quantum dot 5 is larger than this splitting as indicated in FIG. 10. The quantum dot 5 is tuned into resonance with the higher-frequency, H-polarised mode. The laser is V-polarised and blue-detuned with respect to both microcavity modes such that the tails of the laser spectrum and the V-polarised microcavity mode overlap at the frequency of the H-polarised mode (cf. FIG. 10). The quantum dot 5 emits preferentially into the H-polarised microcavity mode. According to a preferred embodiment, a cross-polarised scheme now separates the V-polarised laser pulses from the H-polarised single photons with a loss depending only on the unwanted coupling of the quantum dot 5 to the V-polarised mode. Advantageously, provided that the mode-splitting is larger than the mode linewidths, this loss is small.

Figure 6:
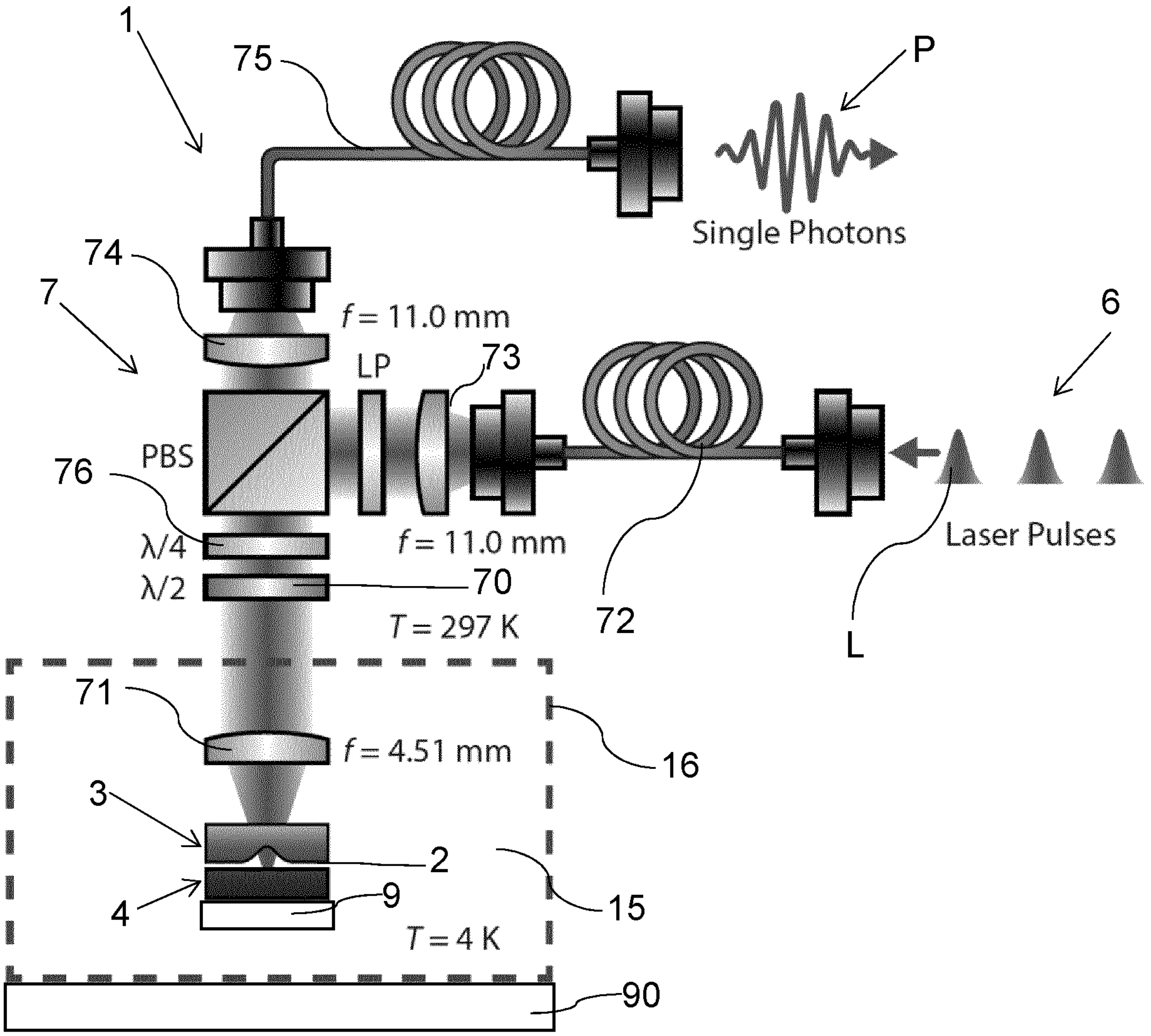

According to a preferred embodiment, the microcavity 2 and an objective lens 71 of a microscope 7 of the single photon source 1, via which objective lens 71 the laser pulses L are passed into the microcavity 2 are mounted in a helium bath-cryostat (T=4.2 K) 15. A window enables free optical-beams to propagate from an optical setup at room temperature to the microcavity system at low temperature, as shown in FIG. 6. Preferably, the first mirror 3 of the microcavity 2 is fixed at the top of a titanium cage 16, inside which the sample, i.e. the first mirror 3 and the semiconductor heterostructure 4 comprising the quantum dot(s) 5 and the second mirror 40, mounted on a positioning device 9, particularly a piezo-driven XYZ nano-positioner 9, is placed. Particularly, the nano-positioner 9 allows for full in situ spatial (XY) and spectral (Z) tuning of the microcavity 2. Preferably, the titanium cage 16 sits on another XYZ nano-positioner 90, which allows for positioning of the microcavity 2 relative to the objective lens 71, leading to close-to-perfect mode matching of the microcavity 2 and the microscope 7. The microscope 7 has a polarisation-based dark-field capability. As shown in FIG. 6, laser light L is input into the microscope 7 via a single-mode fibre 72. The beam is preferably collimated by an e.g. $f_{fibre}$=11 mm aspheric lens (60FC-4-A11-02, Schäfter+Kirchhoff GmbH) 73. Furthermore, particularly, a linear polariser LP guarantees the polarisation-matching of the input beam to a polarising beam-splitter PBS which reflects the light towards the microcavity 2. Preferably, a half-wave plate 70 allows the axis of the polarisation to be rotated: the output state is chosen to match one of the principal axes of the microcavity 2, the V-axis. The light L is then coupled into the microcavity 2 by the objective lens 71. The same objective lens 71 collects the microcavity output. H-polarised light is transmitted by the PBS and focused by a lens 74 (e.g. 60FC-4-A11-02, Schäfter+Kirchhoff GmbH) into a single-mode optical fibre 75 (e.g. 780 HP fibre, Thorlabs Inc.). In the dark-field scheme, the suppression of V-polarised laser light is optimised by adjusting an additional quarter-wave plate 76 in the main beam-path.

Confocal detection is crucial. For continuous wave excitation, an extinction ratio up to $10^8$ is achieved and remains stable over many days of measurement. The estimation of the microcavity beam waist (see above) is used in an embodiment to optimise the fibre-coupling efficiency by selecting an appropriate aspheric lens in front of the optical fibre. According to an embodiment, the objective lens 71 (e.g. 355230-B, NA=0.55, Thorlabs Inc.) has a focal length of e.g. $f_{obj}$=4.51 mm. According to an embodiment, its NA is considerably larger than the NA of the microcavity 2 in order to minimise clipping losses.

The lens 74 coupling the output into the final optical fibre 75 is preferably chosen to ensure mode-matching with the single-mode in the fibre 75. Particularly, in an embodiment, the fibre 75 has a nominal mode-field radius of e.g. $\omega_1$=(2.71±0.27) μm at $\lambda_0$=920 nm (e.g. 780 HP fibre, Thorlabs Inc.). Furthermore, the focal length for optimum fibre-coupling is fibre $f_{fibre}=f_{obj}\cdot\omega_1/\omega_0$=(11.6±1.2) mm. Thus, in an embodiment, an $f_{fibre}$=11 mm aspheric lens 74 is chosen for coupling the output into the final optical fibre 75.

Furthermore, according to a preferred embodiment, the laser light source 6 for exciting the quantum dot(s) 5 is formed by a mode-locked laser (e.g. Mira 900-D picosecond mode, Coherent GmbH) that particularly operates at a repetition rate of 76.3 MHz. Particularly, the spectral width lies in the range between 60 and 100 GHz corresponding in the transform-limited case to temporal widths between 5 and 3 ps, respectively. The temporal width is the full-width-at-half-maximum of the intensity.

In order to generate single photons using the single photon source 1 according to the present invention, the coupling of the $X^+$-resonance to the microcavity is maximized. To do this, a decay curve following resonant excitation can be recorded, since the radiative decay rate is largest at maximum coupling. The quantum dot and microcavity frequencies are tuned to establish a resonance (cf. panel A of FIG. 4). The Purcell-factor is determined by scanning the microcavity frequency: on resonance with a microcavity mode, the decay time is just 47.5 ps; far detuned, the decay time tends to 520 ps, resulting in $F_P$=11 for QD1 ($F_P$=13 for QD6) (cf. panel B of FIG. 4). On resonance with the H-polarised microcavity mode, the probability of emission into the H-polarised mode is determined to be $\beta_H$=86%.

Now, the flux of single photons is maximized. Implementing the excitation scheme as shown FIG. 1C, the central frequency of the laser light source is tuned to find the maximum signal. As a function of laser power, the quantum dot signal exhibits oscillations, indicative of Rabi oscillations (cf. panel C of FIG. 4). The laser power is set at the maximum signal corresponding to the best implementation of a π-pulse. An intensity autocorrelation measurement demonstrates clear photon antibunching and a high purity of single photon generation, $g^2(0)$=2.1% (cf. panel A of FIG. 7). The purity is limited by a small amount of laser light leaking into the detection channel (0.3% of total signal) and double-excitation events.

The main new feature over previous designs is the very high efficiency of the single photon source according to the present invention.

On excitation with a 7-pulse, an on-demand, coherent single photon is obtained in the collection fibre with a probability of 57%. The efficiency is determined from the photon flux. At a repetition frequency of 76.3 MHz, the beam is attenuated by a factor of 9.9 (to avoid saturating the detector) and the count rate is measured (cf. panel C of FIG. 4). Taking account of the detector efficiency and a small nonlinearity in the detector's response (see below), the end-to-end efficiency, the probability of creating a single photon at the output of the system's final optical fibre, is determined to be (53±3)% for quantum dot QD1 and (57±3)% for quantum dot QD6.

For detecting the generated single photons, two photon-counting detectors were used according to examples of the present invention, a superconducting NbTiN-nanowire single-photon detector (SNSPD) unit (EOS 210 CS Closed-cycle, Single Quantum B.V.) optimised for operation at 950 nm; and a near-infrared optimised, fibre-coupled silicon avalanche photodiode (APD, model SPCM-NIR, Excelitas Technologies GmbH & Co. KG). In order to determine the efficiency of single-photon creation of the present invention, a careful calibration of the detectors' efficiencies was performed. The measurement relies on a setup with a free-space laser beam (out-coupled from an optical fibre with angled facet), a set of calibrated neutral density filters (NDs) that can be placed in and out of the beam path, and a second optical fibre into which the beam is coupled (in-coupling via an angled facet). The frequency v of the laser light is determined precisely prior to measurement with a interferometric device (HighFinesse Laser and Electronic Systems GmbH). For optical power P, the photon flux is $$\frac{P}{h\nu}$$

where h is Planck's constant. With the NDs removed from the beam's path, the optical power emerging out of the second fibre is measured with a calibrated silicon photodiode (Sensor Model S130C, Power measuring console PM100D, Thorlabs Inc.). The attenuating NDs are subsequently placed into the beam's path in order to avoid saturating the photon-counting detectors. The photon rate out of the fibre is then measured using both the SNSPD and the APD. The efficiency of each detector is given by the ratio of the measured count-rate to the known photon flux.

The efficiency of the SNSPD is determined to be $\eta_{SNSPD}$=(82±5)%. This value matches closely the specifications provided by the manufacturer at a wavelength of 940 nm. The efficiency of the APD is $\eta_{APD}$=(42±3)% with an angled facet directly in front of the detector (FC-APC type fibre). The efficiency is slightly higher, $\eta_{APD}$=(44±3)%, with a flat facet directly in front of the detector (FC-PC type fibre). The errors in the measurements arise from 4% in the calibration of the NDs, 1.5% in the calibration of the NDs, 3% nominal error of the silicon photodiode, and shot noise in the detectors (1.0%). For the APD, due to the dead-time of the detector (typically ~20 ns), a linearity correction factor must be applied to count rates above 200 kHz. This correction factor scales quadratically from 1 at 200 kHz to 3.32 at 25 MHz.

The appropriate correction factor was applied to take this effect into account. It results in a change in efficiency of a few % at the count rates in panel C of FIG. 4.

Furthermore, the coherence of the generated single photons can be probed with two-photon interference, a Hong-Ou-Mandel (HOM) experiment (the procedure to extract the visibility of the Hong-Ou-Mandel (HOM) interference and present the visibility of the HOM interference as a function of the delay between single photons from the same source will be outlined further below).

Figure 7:
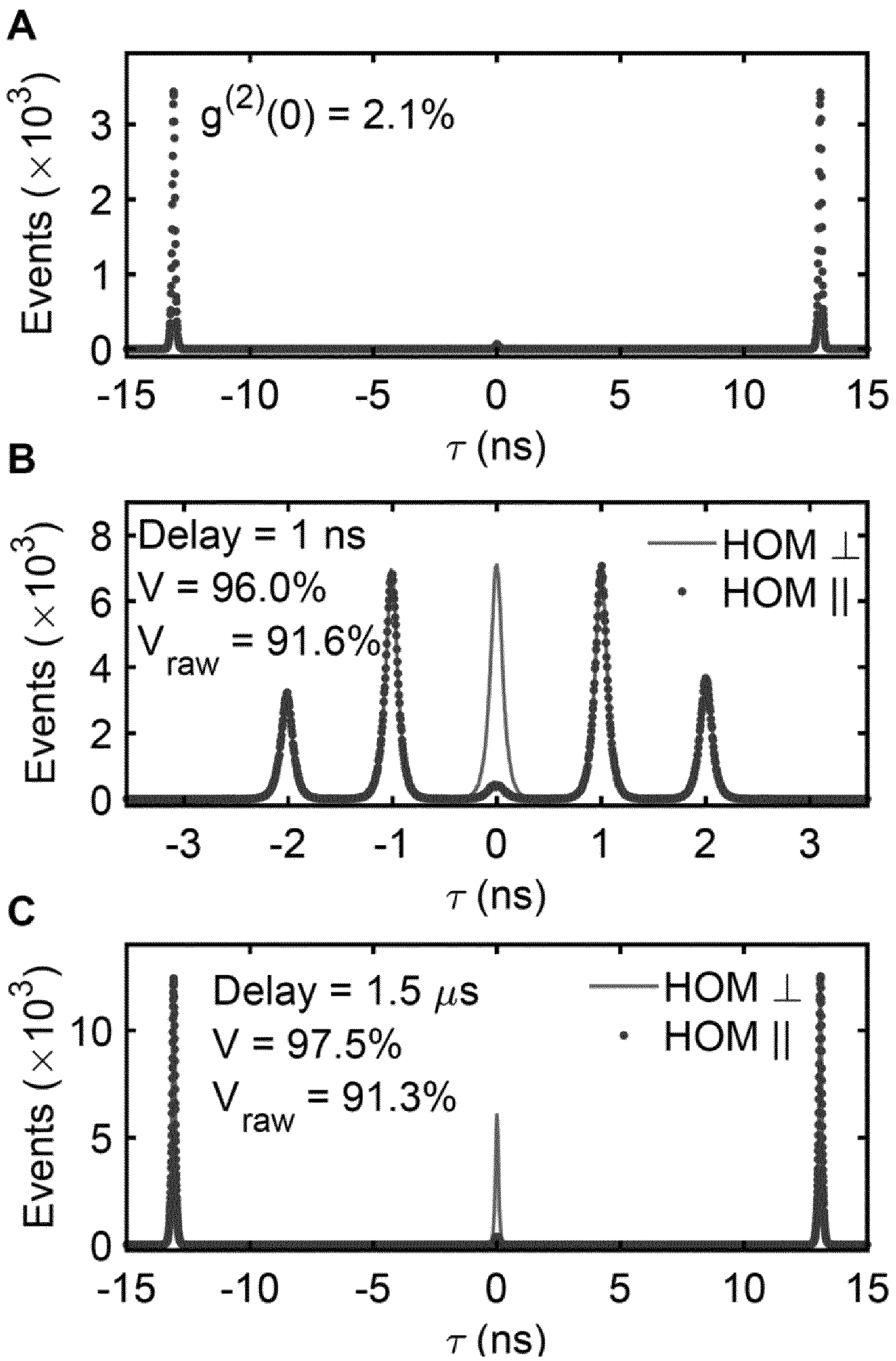

On creating two photons 1 ns apart in time, the raw HOM visibility is $V_{raw}$=91.6% (cf. panel B of FIG. 7). Correcting for a small imperfection in the HOM interferometer, $V_{raw}$=92.5%. The HOM visibility is negatively influenced by the finite $g^{(2)}(0)$: following the standard procedure, the "true" photon overlap can be estimated to be $V \approx (1+2g^{(2)}(0)) \cdot V_{raw}$=96.7%. This demonstrates that successively generated photons are highly coherent. Crucial however is the coherence of photons separated much further apart in time. The HOM visibility on interfering two photons separated by 1.5 μs in time is equally high (cf. panel C of FIG. 7). Given that photons can be created each nano-second (cf. panel B of FIG. 7), these experiments demonstrate that the single photon source according to the present invention can produce a string consisting of thousands of highly coherent photons. The coherence time of the single photon source is clearly much larger than 1.5 μs.

Figure 8:
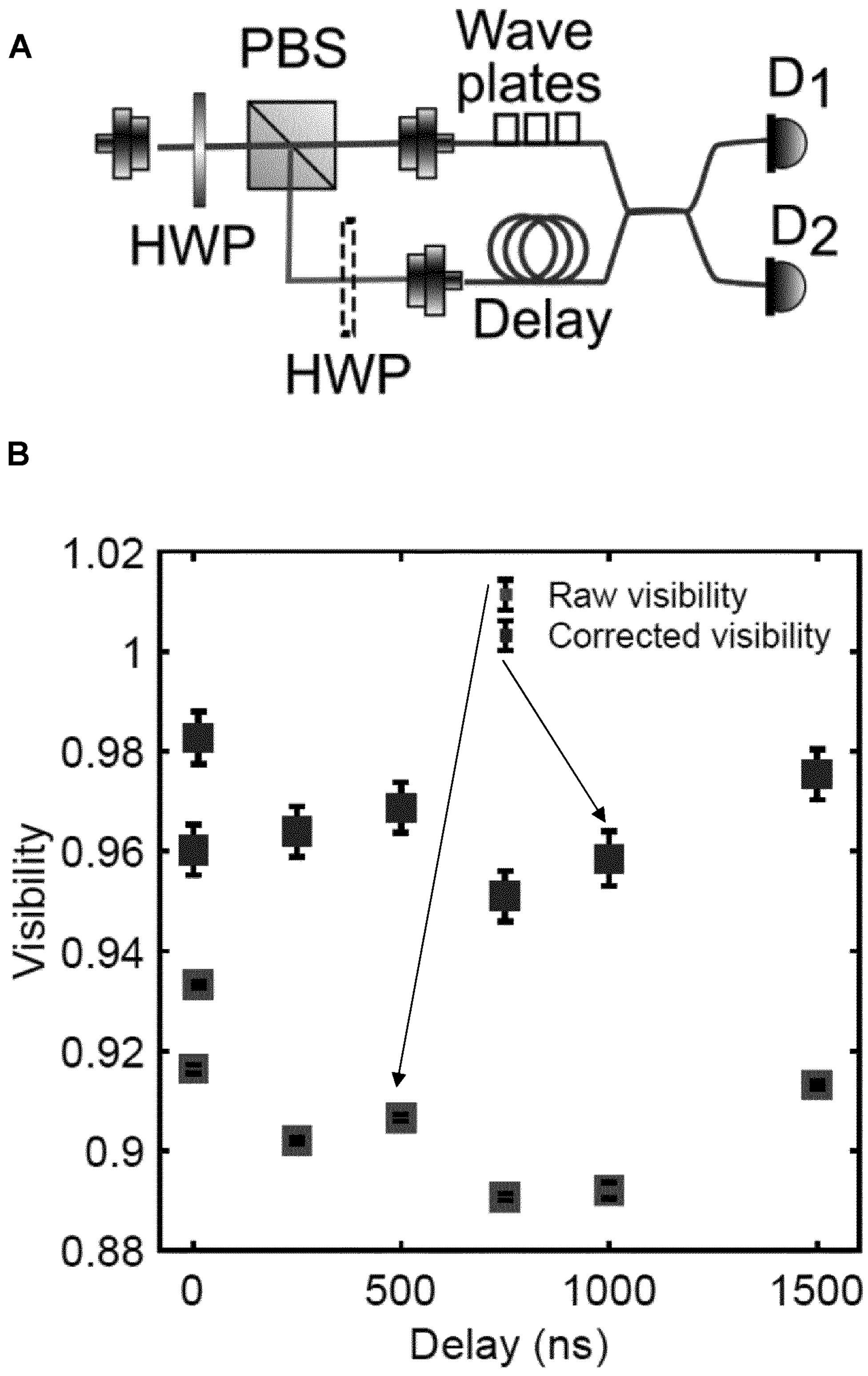

Particularly, the HOM interference between subsequent photons can be measured by launching the stream of single photons into a Mach-Zehnder interferometer with a variable arm. The variable arm introduces a time delay between the photons that interfere. Panel A of FIG. 8 shows the optical setup for the HOM measurements. The combination of a half-wave plate and a polarizing beam splitter PBS is used to realise a variable beam-splitter. Three fibre-based wave-retarders are utilised to match the polarisation of the light at the inputs of the fibre beam-splitter, and hence to maximise the classical visibility of the interferometer (1−ϵ). In order to quantify the interference between the two photons, the time delay between the "clicks" on the two detectors $D_1$ and $D_2$ is measured in the case when the classical visibility of the interferometer is maximised ($HOM_{\parallel}$). The data-points in panels B and C of FIG. 7 correspond to $HOM_{\parallel}$ measurements. A second half-wave plate can be inserted into the beam path to make the photons from the two arms distinguishable and hence yield the solid curves labeled HOM1, in panels B and C of FIG. 7. The raw visibility of the HOM interference is calculated as the ratio of the area underneath the curve around zero delay for the two measurements, $$V_{raw} = 1 - \frac{A_{\parallel}}{A_{\perp}}.$$

Imperfections in the HOM setup as well as the finite value of $g^{(2)}(0)$ influence the measured $V_{raw}$. These imperfections can be accounted for in order to determine the true overlap V of two single photon states produced by the source. If $P_2$ is the probability of creating two photons with one laser pulse, $P_1$ the probability of creating a single photon and $P_0$ the probability of creating the vacuum state, then V can be calculated from $V_{raw}$ under the assumptions that $P_2 \ll P_1 \ll P_0$ and that the two photons in the two-photon pulse are distinguishable. In principle, further corrections arise in the case $P_2 \ll P_1$ but $P_1 \geq P_0$, as achieved at the output fibre of the experiment. (An additional HOM signal arises when a two-photon and a single-photon pulse are created successively.) In practice however, the HOM setup has a low throughput and hence the assumption $P_2 \ll P_1 \ll P_0$ is reasonably fulfilled in the HOM measurements. The result is $$V = \frac{1}{(1-\varepsilon)^2}\left(1 + 2g^{(2)}(0)\right)\left(\frac{R^2+T^2}{2RT}\right)V_{raw}$$

where T and R are the transmission and reflection coefficients of the fibre beam-splitter, and (1−ϵ) is the classical visibility of the interferometer. Assuming further that R and T are close to 50%, $$V = \frac{1}{(1-\varepsilon)^2}\left(1 + 2g^{(2)}(0)\right)\left(1 + 2(R-T)^2\right)V_{raw}$$

We characterised the optical setup and extracted R=0.495, T=0.505 and (1−ϵ)=0.995±0.0025. The correction due to the imbalance in the beam-splitter is negligible as the splitting ratio is close to 0.5:0.5 such that the main contributions to the correction arise from the limited visibility of the interferometer and the small but finite $g^{(2)}(0)$ of the source. Panel B of FIG. 8 shows the raw and the corrected HOM visibilities as a function of the delay in the interferometer. The error bars on $V_{raw}$ represent the errors arising from the shot noise of the detector. The error bars on V include in addition uncertainties in the exact visibility of the interferometer and uncertainties in $g^{(2)}(0)$. Within error, V is insensitive to the time delay between the interfering photons, indicating that the coherence time of the source is significantly longer than 1.5 μs.

Figure 9:
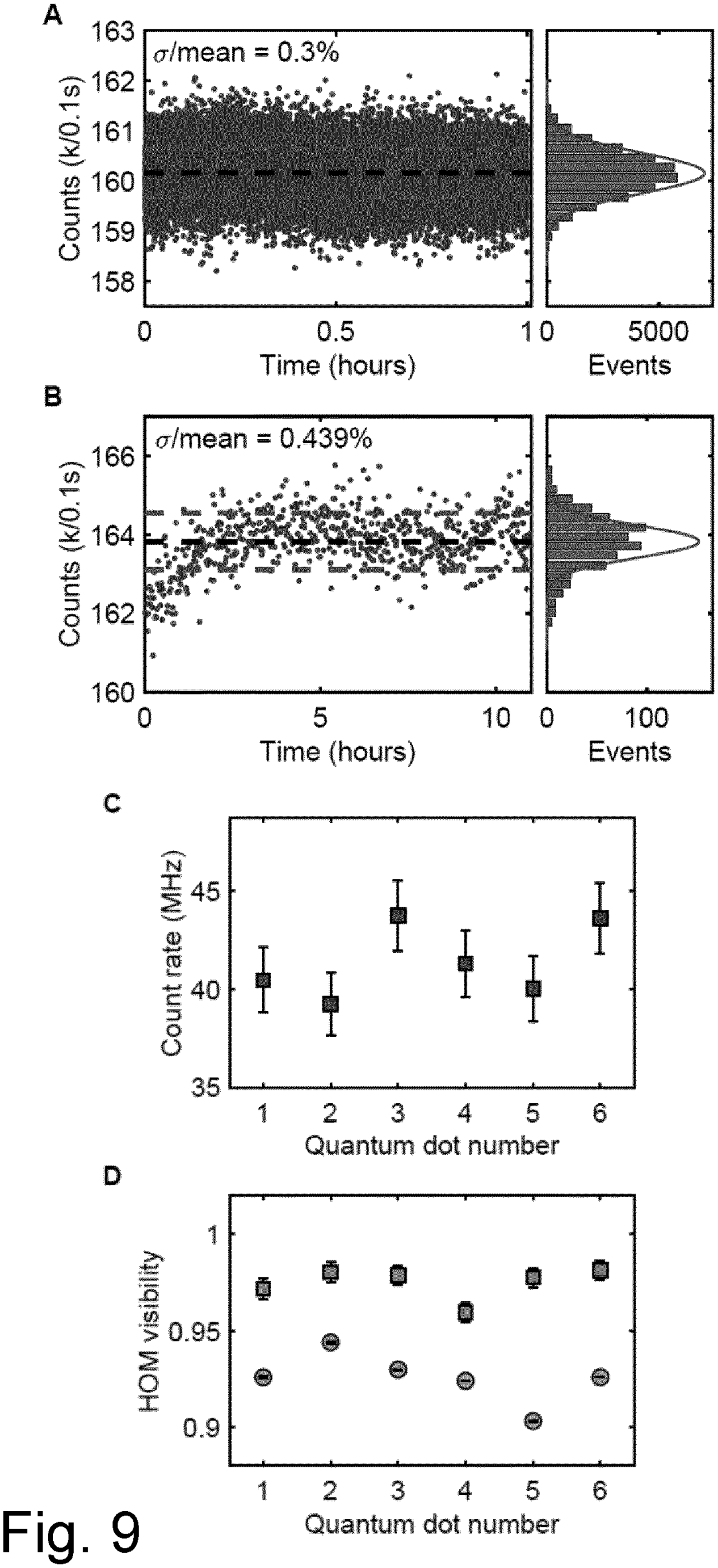

The single photon source according to the present invention is very stable in time. The noise in the single photon flux is limited by shot-noise on time-scales of one hour (cf. panel A of FIG. 9), increasing only slightly on timescales of multiple hours (cf. panel B of FIG. 9). The tunability of the microcavity enables one to bring multiple quantum dots one-by-one into resonance with the same microcavity mode. Six quantum dots 5, denoted QD1 to QD6, were investigated in detail. All six have essentially the same values of single photon purity, end-to-end efficiency (cf. panel C of FIG. 9) and coherence (cf. panel D of FIG. 9).

The end-to-end efficiency, Σ, here 53% to 57% (QD1 to QD6), is a product of factors, $\Sigma=\pi\cdot\beta_H\cdot\kappa_{top}//(\gamma+\kappa_{total})\ \eta_{optics}$ where π is the probability of producing a photon on excitation with a laser pulse; and $\eta_{optics}$ represents the throughput of the entire optical system (from microcavity to the output from the final output fibre). $\beta_H$ and $\kappa_{top}/(\gamma+\kappa_{total})$ are both determined precisely in the experiment, 86% and 96%, respectively. $\beta_H$ matches theoretical expectations based on the optical dipole moment and the microcavity geometry (see above).

Figure 1C:
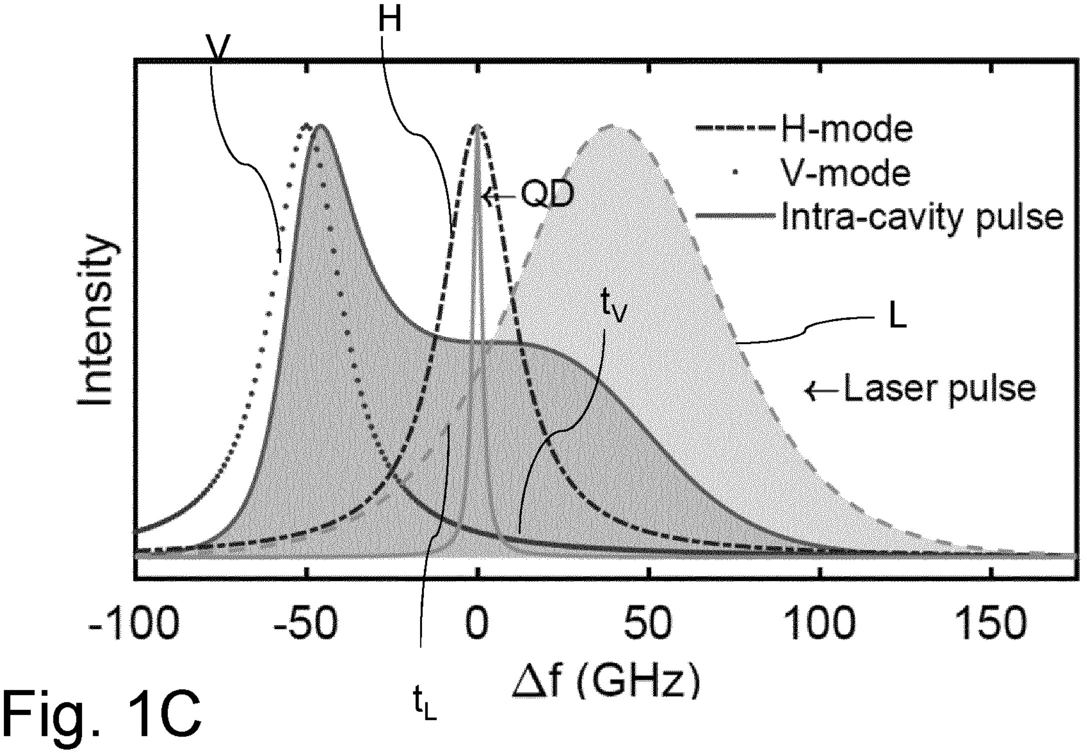

The experimental results can be described using a theoretical model, particularly for determining said probability π, that is based on a Hamiltonian of a two-level system (TLS) interacting with a drive field and a resonant cavity mode, wherein the H-polarised mode is given by:

$$\hat{H} = \frac{\hbar\omega_0}{2}\hat{\sigma}_Z + \frac{\hbar}{2}(\Omega^-(t)\hat{\sigma}_+ + \Omega^+(t)\hat{\sigma}_-) + \hbar g(\hat{a}_H^\dagger\hat{\sigma}_- + \hat{a}_H\hat{\sigma}_+),$$

where $h\omega_0$ is the energy difference between the excited state and the ground state of the TLS, g is the coupling constant between the cavity and the TLS, $\Omega^\pm(t)$ are the positive and negative frequency components of the driving field, and $\hat{\alpha}_H$ is the annihilation operator for the H-polarised cavity mode. In this work, the TLS is resonant with the H-polarised cavity mode but the optical pulses enter the cavity via the red-detuned V-polarised cavity mode. The optical pulse (frequency $\omega_L$) is blue-detuned (by frequency $\Delta_L$) with respect to the H-polarised cavity mode, $\Delta_L=\omega_L-\omega_0$. (The scheme is shown in FIG. 1*c*.) As such, the TLS is driven not by the bare optical pulse but by the pulse modified by the off-resonant V-polarised cavity mode. $\Omega^\pm(t)$ can be calculated by convoluting the optical pulse with the impulse response function of a cavity, i.e. $e^{(-\kappa t/2)}\cos(\omega_c t)$, retaining the positive (negative) frequency components. ($\omega_c$ is the angular-frequency of the cavity, here that of the V-polarised cavity mode.) We introduce leakage out of the cavity mode with the Lindblad operator $\hat{\mathcal{L}}=\sqrt{\kappa}\hat{\alpha}_H$, where κ is the decay rate of the cavity mode. Phonon-induced dephasing is modeled with $\hat{\mathcal{L}}=\sqrt{AT/2}|\Omega(t)|\hat{\sigma}_z$, where T is the temperature of the phonon bath, and A is the parameter describing the interaction between the phonons and the exciton. Finally, the photon emission probability is calculated as $$\int \kappa\langle\hat{a}_H^\dagger\hat{a}_H\rangle dt.$$

We use the Python package Qutip to set up and solve the equations of motion based on the Hamiltonian stated above. Panel A of FIG. 10 shows the photon emission probability as a function of the laser frequency and excitation power. In these simulations, the excitation cavity is −50 GHz away from the TLS resonance corresponding to the mode-splitting of the microcavity (QD1), and the pulse width is $t_p$=5.2 μs (defined as the full-width-at-half-maximum of the laser intensity). The photon emission probability shows Rabi-like oscillations as expected from a driven TLS. However, as evident from the plot, the full inversion of the TLS takes place when the excitation laser is blue-detuned from the TLS resonance contrary to the textbook case where maximum inversion is obtained under strict resonance conditions. The crucial point is that the incomplete Rabi oscillations do not signify an incomplete inversion of the TLS. On the contrary, by choosing the optimal detuning of the laser pulse, the photon emission probability reaches values close to one (cf. panel B of FIG. 10). We model the experimental results with the following parameter set: $\Delta_L/(2\pi)$=32 GHz, $t_p$=5.2 μs, and A=32 fs/K. These parameters match well with the expected pulse-width based on the measured spectral width and the detuning $\Delta_L/(2\pi)$=32 GHz found in the experiment. With these parameters, the model shows that a near complete inversion of the TLS is possible. As shown in panel B of FIG. 10, the calculated photon emission probability is 96.3% at the first Rabi peak. Excitation-induced dephasing is important to describe the subsequent Rabi peak but results in only a small decrease at the first Rabi peak.

The calculation outlined above describes the Rabi oscillations very successfully (cf. panel C of FIG. 4), so that one can infer that at the peak signal, π=96.3%. The remaining factor, $\eta_{optics}$ (68%), accounts for the throughput losses in the optical components, losses on coupling the single photons into the single-mode fibre, and reflection losses at three surfaces (upper surface of top mirror, two fibre facets) which lacked an antireflection coating. The conclusion of this analysis is that the main contribution to the losses lies in $\eta_{optics}$, i.e. in the classical optics. These losses can be remedied. The quantum effects, the coupling to the vacuum mode of the microcavity and the scheme to invert the two-level system via the off-resonance microcavity mode, are under excellent control.

Based on this analysis, a single photon source with an end-to-end efficiency of 80% is within reach. A further broad area of application exploits the spin of the trapped hole. By implementing spin manipulation in the microcavity device, for instance via lateral excitation (an "atom" drive), the efficient and fast creation of spin-photon entangled pairs will become possible, also multi-photon cluster states.

Figure 11:
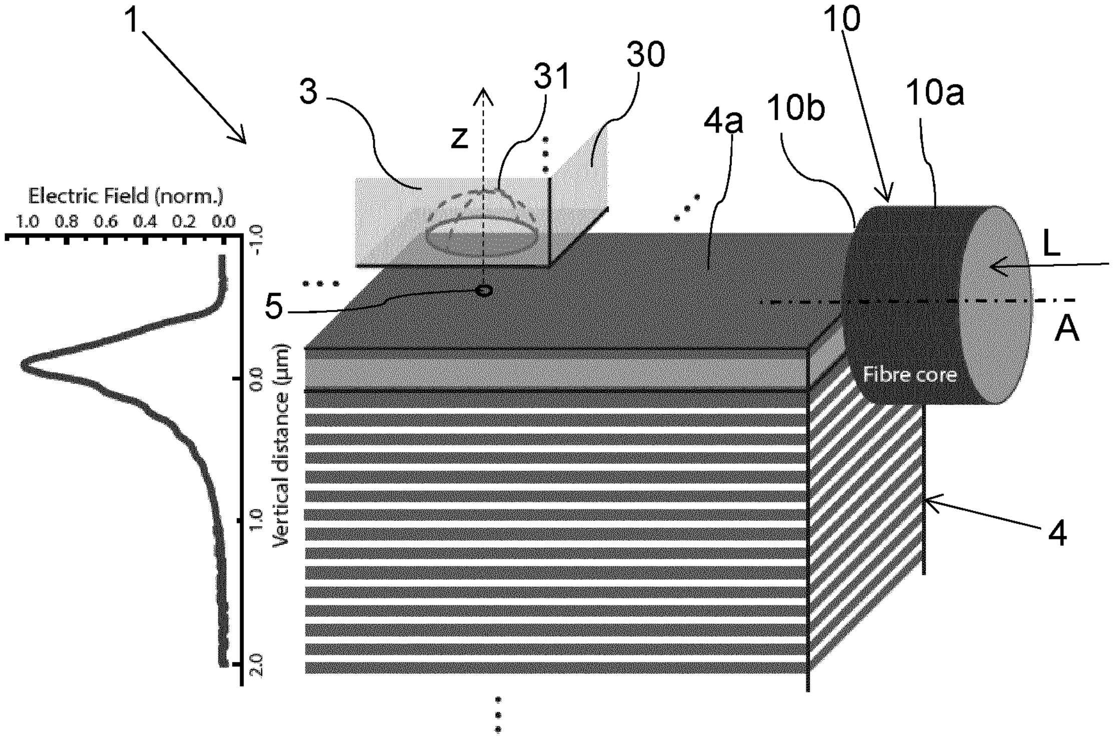

FIG. 11 shows an embodiment of the single photon source 1 using a lateral excitation scheme. Particularly, using a lateral excitation scheme allows eliminating the mode-splitting and an optical transmission close to 100% is feasible by removing unnecessary optical elements in the microscope 7 (cf. FIG. 6). Employing the microcavity 2 as described herein, then allows increasing the overall efficiency to about 87%.

In the embodiment shown in FIG. 11, the semiconductor heterostructure 4 supports a near-surface optical mode which propagates in the lateral direction, i.e. perpendicular to the microcavity axis or optical axis z. This allows exciting the respective quantum dot(s) 5 by coupling light into this lateral mode in order to implement a so-called "atom drive". To this end, an optical fibre 10 is positioned laterally adjacent to the semiconductor heterostructure 4 such that some of the light in the optical fibre 10 couples into the laterally-propagating mode in the semiconductor heterostructure 4. Particularly, the optical fibre 10 comprises an end section 10*a* extending along a longitudinal axis A that is oriented orthogonal with respect to the microcavity axis or optical axis z. The end section 10*a* is arranged such that a face side 10*b* of the end section 10*a* of the optical fibre 10, via which face side 10*b* the laser light L exits the end section

10*a* of the optical fibre 10, faces an edge of the surface 4*a* of the semiconductor heterostructure 4 to couple the light L into the microcavity 2.

Figure 12:
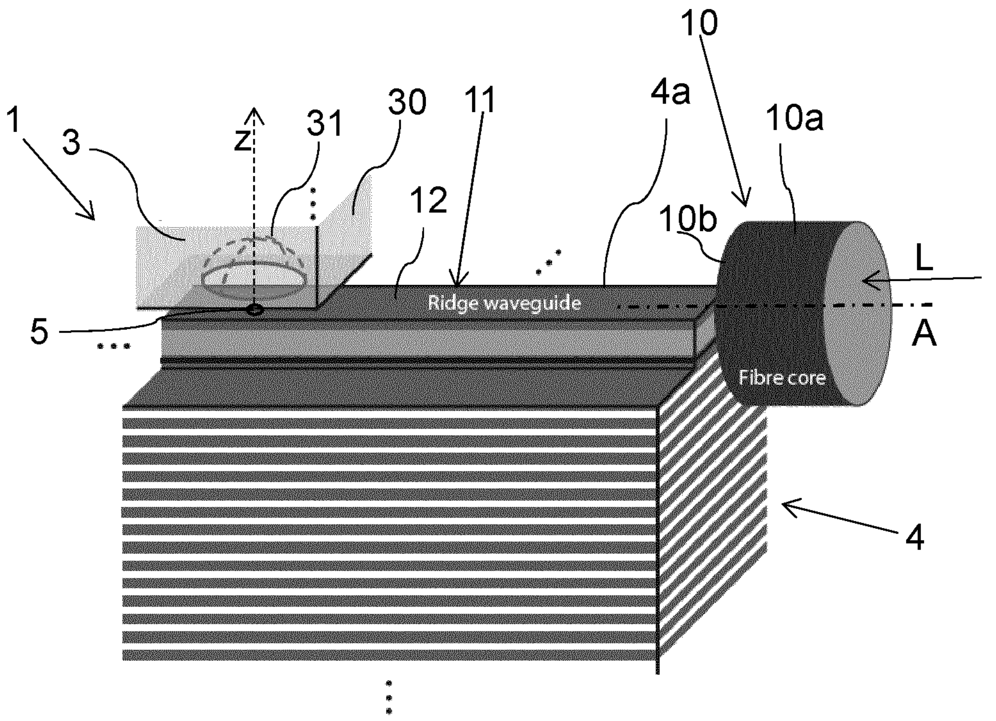
FIG. 12 shows a modification of the embodiment shown in FIG. 11, wherein a waveguide comprising a ridge is arranged on the surface of the semiconductor heterostructure, wherein the waveguide prevents the light from expanding in the lateral plane; the curved first mirror is positioned over the ridge of the waveguide.

Furthermore, FIG. 12 shows a modification of the embodiment shown in FIG. 11, wherein a waveguide 12 comprising a ridge 12 is integrated into the surface 4*a* of the semiconductor heterostructure 4. The waveguide 11 prevents the laser light L from expanding in the lateral plane. Particularly, the ridge 12 is aligned with the longitudinal axis A of the end section 10*a* of the optical fibre 10 and the face side 10*b* of the end section 10*a* of the optical fibre 10 faces the ridge 12 in the direction of the longitudinal axis A. Furthermore, the curved first mirror 3 is positioned over the ridge 12 of the waveguide 11.

Figure 13:
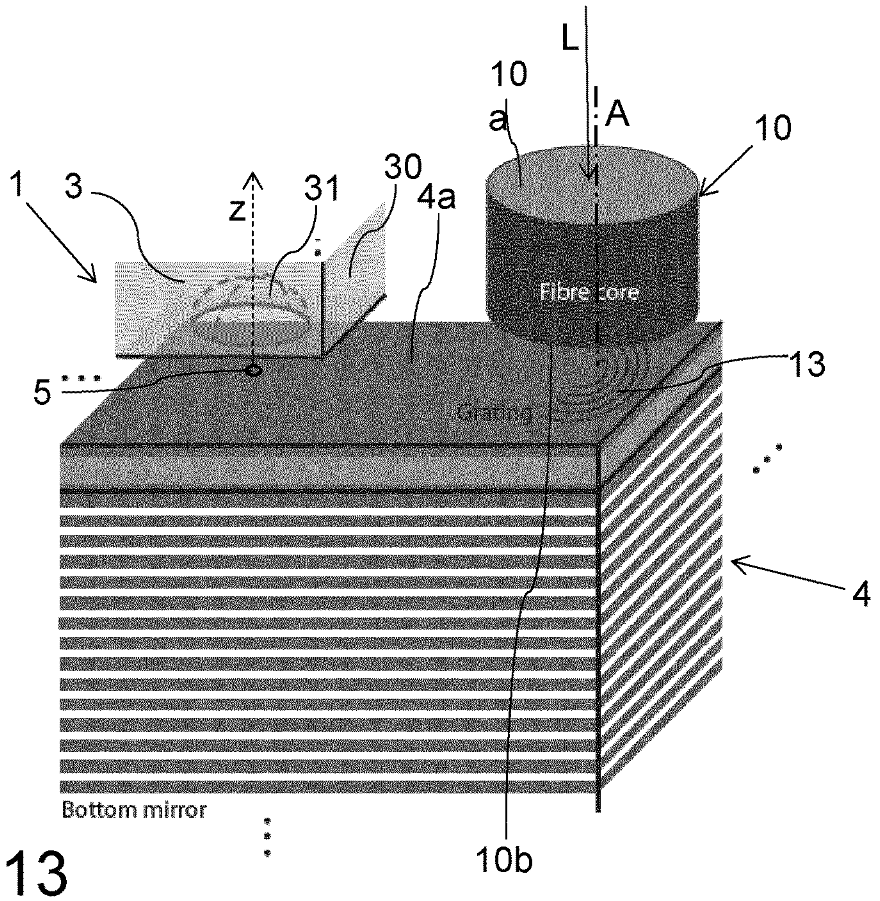
FIG. 13 shows another modification of the embodiment shown in FIG. 11, wherein the optical fibre is positioned close to a diffraction grating etched into the surface of the semiconductor heterostructure. In this case, the optical fibre is held perpendicular to the surface and the grating diffracts the light into the lateral direction.

FIG. 13 shows yet another modification of the embodiment shown in FIG. 11, wherein the optical fibre 10 is positioned close to a diffraction grating 13 etched into the surface 4*a* of the semiconductor heterostructure 4. Here, the end section 10*a* of the optical fibre 10/longitudinal axis A is arranged perpendicular to the surface 4*a* and the grating 13 diffracts the light into the lateral direction, i.e. along the surface 4*a*.

Figure 14:
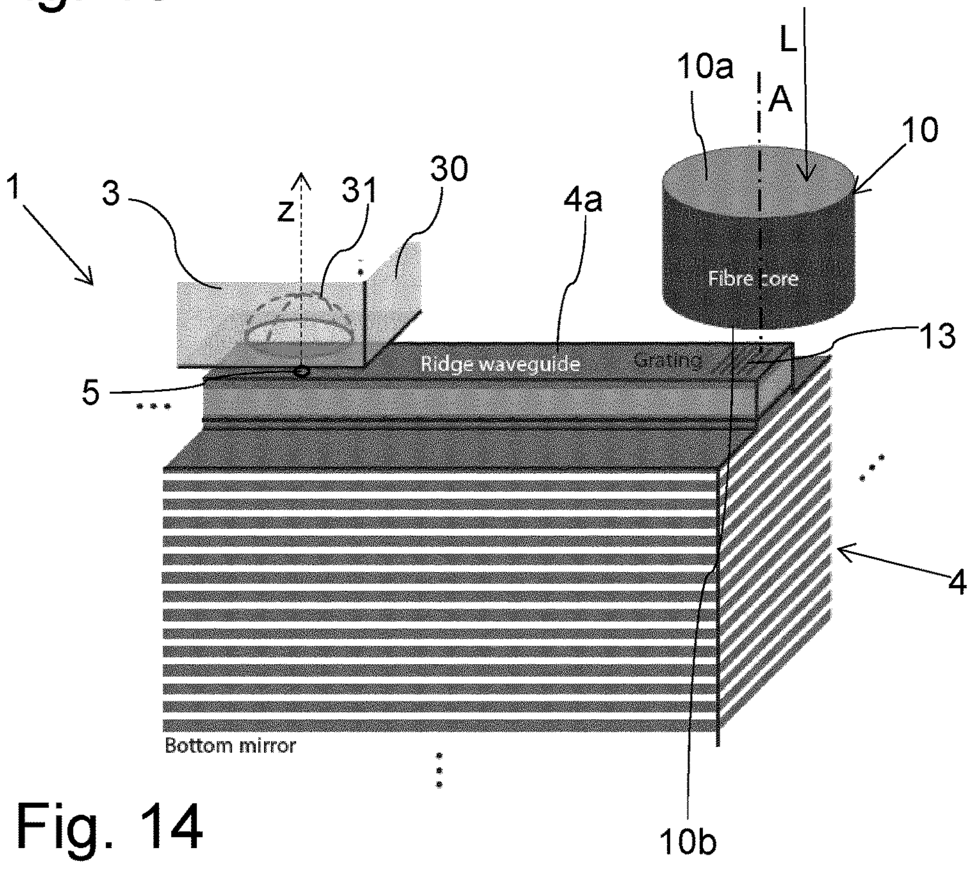
FIG. 14 shows a combination of the embodiments shown in FIGS. 12 and 13, wherein the grating is fabricated in the ridge of the waveguide.

As shown in FIG. 14, in case a waveguide 11 is used as indicated in FIG. 12, a grating 13 can be formed in the ridge 12 of the waveguide 11 and the optical fibre 10 can be arranged such that the face side 10*b* of the end section 10*a* of the optical fibre 10, via which face 10*b* the laser light L exits the optical fibre 10, faces the grating 13. Here, the longitudinal axis is oriented orthogonal with respect to the surface of the ridge 12 over which the first mirror 3 is arranged (i.e. the longitudinal axis extends parallel to the microcavity axis or optical axis z).

Generally, the means for coupling the laser light L laterally into the microcavity 2 does not need to be integrated into the semiconductor heterostructure 4, but can also be formed by a separate external coupling unit 14 as shown in FIG. 15. Such an external coupling unit 15 can use the above-described designs integrated into the semiconductor heterostructure. As an example, FIG. 15 shows such an external coupling unit 14 comprising an (e.g. patterned) waveguide 11 comprising a ridge 12 and a diffraction grating 13 arranged on the ridge 12 of the waveguide 11 to couple light into the microcavity 2 in a lateral fashion. Particularly, the external coupling unit 14 can be constructed out of silica or silicon nitride and can be configured to couple light from an optical fibre 10 having an end section 10*a* oriented perpendicular to the surface 4*a* of the semiconductor heterostructure/external coupling unit 14 into, first, the waveguide 11, and subsequently, into the semiconductor heterostructure 4.

Furthermore, FIG. 16 shows a further modification of the single photon source 1 shown in FIG. 11, wherein in contrast to FIG. 11, the single photon source 1 comprises a tapered optical fibre 10, wherein the tapered optical fibre 10 allows the transmission of an electromagnetic field E through the fibre 10 comprising an optical mode, and wherein the optical fibre 10 comprises a tapered region 10*c* of reduced diameter which allows an evanescent electromagnetic wave with extended length away from the core of the fibre. The tapered optical fibre 10 is preferably arranged parallel to the surface 4*a* of the semiconductor heterostructure 4, as to have the evanescent field E coupled to the said optical mode confined to the surface 4*a* of the semiconductor heterostructure 4.

FIG. 17 shows a further variant of the embodiment shown in FIG. 16, wherein here the tapered region 10*c* of the optical fibre 10 comprises a loop that allows the fibre 10 to be brought in closer proximity to the surface 4*a* of the semiconductor heterostructure 4 for coupling the light L to the said optical mode confined to the surface 4*a* of the semiconductor heterostructure 4.

FIG. 18 shows a further variant of the embodiment shown in FIG. 16, wherein here the tapered region 10*c* of the optical fibre 10 comprises a dimple that allows the fibre 10 to be brought in closer proximity to the surface 4*a* of the semiconductor heterostructure 4 for coupling the light L to the said optical mode confined to the surface 4*a* of the semiconductor heterostructure 4.

References

Somaschi, N. et al. Near-optimal single-photon sources in the solid state. Nature Photonics 10, 340-345 (2016).

Loredo, J. C. et al. Scalable performance in solid-state single-photon sources. Optica 3, 433-440 (2016).

Ding, X. et al. On-demand single photons with high extraction efficiency and near-unity indistinguishability from a resonantly driven quantum dot in a micropillar. Phys. Rev. Lett. 116, 020401 (2016).

Wang, H. et al. Near-transform-limited single photons from an efficient solid-state quantum emitter. Phys. Rev. Lett. 116, 213601 (2016).

Unsleber, S. et al. Highly indistinguishable on-demand resonance fluorescence photons from a deterministic quantum dot micropillar device with 74% extraction efficiency. Optics Express 24, 8539-8546 (2016).

Wang, H. et al. Towards optimal single-photon sources from polarized microcavities. Nature Photonics 13, 770-775 (2019).

Liu, F. et al. High Purcell factor generation of indistinguishable on-chip single photons. Nature Nanotechnology 13, 835-840 (2018).

Arcari, M. et al. Near-unity coupling efficiency of a quantum emitter to a photonic crystal waveguide. Phys. Rev. Lett. 113, 093603 (2014).

Uppu, R. et al. Scalable integrated single-photon source. arXiv:2003.08919 (2020).

Muller, A. et al. Resonance Fluorescence from a Coherently Driven Semiconductor Quantum Dot in a Cavity. Phys. Rev. Lett. 99, 187402 (2007)

Huber, T. et al. Filter-free single-photon quantum dot resonance fluorescence in an integrated cavity-waveguide device. Optica 7, 380-385 (2020)

Paesani, S. et al. Near-ideal spontaneous photon sources in silicon quantum photonics. Nat. Comm. 11, 2505 (2020)

The invention claimed is:

1. A single photon source (1), comprising:

a microcavity (2) arranged between a concave first mirror (3) and a semiconductor heterostructure (4) forming a planar second mirror (40), wherein the microcavity (2) supports an optical mode, a quantum dot (5) embedded in the semiconductor heterostructure (4) and facing the first mirror (3), and a laser light source (6) configured to provide laser light to excite the quantum dot (5) to emit single photons (P) exiting the microcavity (2), wherein the microcavity (2) comprises a first optical mode (H) having a first optical frequency and a second optical mode (V) having a different second optical frequency, wherein a spectrum of the laser light (L) is broader than the absolute difference between the first and the second optical frequency, or the semiconductor heterostructure (4) comprises a surface (4*a*) facing the first mirror (3) in the direction of an optical axis (z) of the single photon source (1), wherein the optical mode is an optical mode confined to the surface (4*a*) of the semiconductor heterostructure (4), wherein the laser light source (6) is configured to excite the quantum dot (5) laterally via said optical mode confined to the surface (4*a*) of the semiconductor heterostructure (4).

2. The single photon source according to claim 1, wherein the single photon source (1) is tunable to bring the quantum dot (5) into resonance with the first optical mode (H) or with the second optical mode (V).

3. The single photon source according to claim 1, wherein the laser light (L) is detuned with respect to the first and the second optical mode (H, V).

4. The single photon source according to claim 1, wherein the optical frequency of the first optical mode (H) is larger than the optical frequency of the second optical mode (V).

5. The single photon source according to claim 1, wherein the single photon source (1) is tunable to bring the quantum dot (5) into resonance with the first optical mode (H), wherein the laser light (L) is blue-detuned with respect to the first and the second optical mode (H, V) such that a tail ($t_L$) of the spectrum of the laser light (L) and a tail (tv) of a spectrum of the second optical mode (V) overlap at the optical frequency of the first optical mode (H); or wherein the single photon source (1) is tunable to bring the quantum (5) dot into resonance with the second optical mode (V), wherein the laser light (L) is red-detuned with respect to the first and the second optical mode (H, V) such that a tail of the spectrum of the laser light (L) and a tail of a spectrum of the first optical mode (H) overlap at the optical frequency of the second optical mode (V).

6. The single photon source according to claim 1, wherein the first and the second optical mode (H, V) each comprise a linear polarization, wherein these two linear polarizations are orthogonal to one another.

7. The single photon source according to claim 1, wherein for coupling the laser light (L) into the microcavity (2) and for coupling emitted single photons out of the microcavity (2), the single photon source (1) comprises a microscope (7), particularly a dark-field microscope.

8. The single photon source according to claim 7, wherein the microscope (7) comprises a half-wave plate (70) for aligning a polarization axis of the laser light (L) incident on the microcavity (2) through the first mirror (3) with the polarization of the second optical mode (V).

9. The single photon source according to claim 1, wherein the laser source (6) is configured to provide the laser light (L) in the form of successive laser light pulses, particularly x-pulses.

10. The single photon source according to claim 1, wherein the single photon source (1) is configured to generate an on-demand coherent single photon with a probability of at least 50%, particularly at least 57%, on excitation with laser light (L) in form of a laser light x-pulse.

11. The single photon source according to claim 1, wherein the concave first mirror (3) comprises a substrate (30) comprising a concave recess (31) formed into a surface (30*a*) of the substrate (30), which surface of the substrate (30*a*) faces the semiconductor heterostructure (4).

12. The single photon source according to claim 11, wherein the recess (31) comprises a sagittal height(s) in the range from 0.08 um to 8 μm, preferably in the range from 0.5 um to 2 μm, and/or wherein the recess (31) comprises a radius (R) of curvature in the range from 1.2 um to 70 μm, preferably in the range from 5 μm to 20.

13. The single photon source according to claim 1, wherein the semiconductor heterostructure (4) comprises a diode (41) into which the quantum dot (5) is embedded, and wherein the diode (41) is arranged on the second mirror (40) formed by a distributed Bragg reflector.

14. The single photon source according to claim 1, wherein for tuning the single photon source (1) to bring the quantum dot (5) into resonance with one of: the optical mode, the first optical mode (H), the second optical mode (H), the single photon source (1) comprises a positioning device (9) configured to move the semiconductor heterostructure (4) with respect to the first mirror (3) in order to position the semiconductor heterostructure (4) and therewith the quantum dot (5) with respect to the first mirror (3).

15. The single photon source according to claim 14, wherein the positioning device (9) is configured to move the semiconductor heterostructure (4) along a microcavity axis (z) towards and away from the first mirror (3) as well as along a first and a second lateral direction (x, y), wherein the first and the second lateral direction are both orthogonal to the cavity axis (z) and particularly orthogonal to one another.

16. The single photon source according to claim 1, wherein a reflectivity of the first mirror (3) is lower than a reflectivity of the second mirror (40) such that the emitted single photon (P) exits the microcavity (2) via the first mirror (3).

17. The single photon source according to claim 16, wherein the reflectivity of the first mirror (3) and the reflectivity of the second mirror (40) are selected such that the cavity loss rate $K_{top}$ attributed to the first mirror (3) is larger than the cavity loss rate $K_{bottom}$ attributed to the second mirror (40) by at least a factor of 4, preferably at least a factor of 20, preferably at least a factor of 100, preferably at least a factor of 200, preferably at least a factor of 500, and wherein the total cavity loss rate $K_{total}$ deviates less than 300%, preferably less than 100%, preferably less than 50% from the product 2·g, wherein g corresponds to the atom-cavity coupling.

18. The single photon source according to claim 1, wherein the single photon source (1) comprises an optical fibre (10), wherein the laser light source (6) is configured to deliver laser light (L) generated by the laser light source (6) to the surface (4*a*) of the semiconductor heterostructure (4) through the optical fibre (10) to excite the quantum dot (5) laterally via said optical mode.

19. The single photon source according to claim 18, wherein the optical fibre (10) comprises an end section (10*a*) extending along a longitudinal axis (A).

20. The single photon source according to claim 18, wherein the single photon source (1) comprises a waveguide (11) comprising a ridge (12).

21. The single photon source according to claim 18, wherein the single photon source (1) comprises a grating (13) configured to redirect the laser light (L) along the surface (4*a*) of the semiconductor heterostructure (4).

22. The single photon source according to claim 21, wherein the single photon source (1) comprises a waveguide (11) comprising a ridge (12), wherein the grating (13) is formed on the ridge (12).

23. The single photon source according to claim 21, wherein the grating (13) is formed on the surface (4*a*) of the semiconductor heterostructure (4).

24. The single photon source according to claim 19, wherein the longitudinal axis (A) extends parallel to the surface (4*a*) of the semiconductor heterostructure (4).

25. The single photon source according to claim 19, wherein the longitudinal axis (A) extends perpendicular to the surface (4*a*) of the semiconductor heterostructure (4), wherein a face side (10*b*) of the end section (10*a*) of the optical fibre (10) faces the grating (13).

26. The single photon source according to claim 1, wherein a ridge (12) is formed on the surface (4*a*) of the semiconductor heterostructure (4).

27. The single photon source according to claim 20, wherein the single photon source (1) comprises an external coupling unit (14), wherein the grating (13) and/or the ridge (12) is formed by the external coupling unit (14) arranged laterally with respect to the semiconductor heterostructure (4).

28. The single photon source according to claim 18, wherein the optical fibre (10) comprises a tapered region (10*c*) of reduced diameter configured to allow an evanescent electromagnetic wave (10*d*) of the laser light (L) to exit the tapered region (10*c*) of the optical fibre (10) to have the evanescent electromagnetic wave (10*d*) coupled to said optical mode confined to the surface (4*a*) of the semiconductor heterostructure (4).

29. The single photon source according to claim 28, wherein the tapered region (10*c*) of the optical fibre (10) extends parallel to the surface (4*a*) of the semiconductor heterostructure (4).

30. The single photon source according to claim 28, wherein the tapered region (10*c*) forms a loop or a dimple.

31. The single photon source according to claim 1, wherein the semiconductor heterostructure (4) comprises a surface (4*a*) facing the first mirror (3), wherein said surface (4*a*) is formed at least in sections by a passivation layer (409) of the semiconductor heterostructure (4), which passivation layer (409) preferably comprises or is formed out of $Al_2O_3$.

32. A method for generating single photons, wherein the method comprises the steps of:

exciting a quantum dot (5) embedded in a semiconductor heterostructure (4) to emit single photons by coupling light into a microcavity (2) formed between the semiconductor heterostructure (4) and a concave first mirror (3), wherein the semiconductor heterostructure (4) comprises a planar second mirror (40), wherein the light is coupled into the microcavity (2) along an optical axis (z) running perpendicular to the planar second mirror (40), wherein the microcavity (2) comprises a first optical mode (H) having a first optical frequency and a second optical mode (V) having a different second optical frequency, wherein a spectrum of the laser light (L) is broader than the absolute difference between the first and the second optical frequency, and wherein the single photon source (1) is tuned to bring the quantum dot (5) into resonance with the first optical mode (H) or with the second optical mode (V), wherein the laser light (L) is detuned with respect to the first and the second optical mode (H, V), or an optical mode of the microcavity (1) is used for exciting the quantum dot (5), which optical mode is confined to a region below the surface (4*a*) of the semiconductor heterostructure (4) that faces the first mirror (3), wherein the light (L) is sent laterally into the microcavity (2) in a direction (A) running parallel to the surface (4*a*) of the semiconductor heterostructure (4).

33. The method according to claim 32, wherein the optical frequency of the first optical mode (H) is larger than the optical frequency of the second optical mode (V).

34. The method according to claim 32, wherein the single photon source (1) is tuned to bring the quantum dot (5) into resonance with the first optical mode (H), wherein the laser light (L) is blue-detuned with respect to the first and the second optical mode (H, V) such that a tail ($t_L$) of the spectrum of the laser light (L) and a tail (tv) of a spectrum of the second optical mode (V) overlap at the optical frequency of the first optical mode (H); or wherein the single photon source (1) is tuned to bring the quantum dot (5) into resonance with the second optical mode (V), wherein the laser light (L) is red-detuned with respect to the first and the second optical mode (H, V) such that a tail of the spectrum of the laser light (L) and a tail of a spectrum of the first optical mode (H) overlap at the optical frequency of the second optical mode (V).

35. The method according to claim 32, wherein prior to the step of exciting the quantum dot (5), the method further comprises the steps of:

Application of a gate voltage across a diode (41), comprised by the semiconductor heterostructure (4) to determine a desired charge state of the quantum dot (5);

Positioning the second mirror (40) along an optical axis (z) running perpendicular to the second mirror (40) so as to bring an optical mode of the microcavity (2), particularly said first or second optical mode (H, V), into resonance with a frequency of an optical transition of the quantum dot (5);

Positioning the semiconductor heterostructure (4) in two lateral directions perpendicular to the optical axis (z) to position the quantum dot (5) at an anti-node of the optical mode of the microcavity.

36. The method according to claim 32, wherein the method further comprises the step of:

Collection of the emitted single photons escaping through the first mirror (3) with an objective lens (71) and coupling the emitted single photons into a single-mode optical fibre (75) via a lens (74).

37. A single photon source (1), comprising:

a microcavity (2) arranged between a concave first mirror (3) and a semiconductor heterostructure (4) forming a planar second mirror (40), wherein the microcavity (2) supports an optical mode, a quantum dot (5) embedded in the semiconductor heterostructure (4) and facing the first mirror (3), and a laser light source (6) configured to provide laser light to excite the quantum dot (5) to emit single photons (P) exiting the microcavity (2)

wherein the laser source (6) is configured to provide the laser light (L) in the form of successive laser light pulses, and/or the microcavity (2) comprises a first optical mode (H) having a first optical frequency and a second optical mode (V) having a different second optical frequency, wherein for coupling the laser light (L) into the microcavity (2) and for coupling emitted single photons out of the microcavity (2), the single photon source (1) comprises a microscope (7), wherein the microscope comprises a half-wave plate (70) for aligning a polarization axis of the laser light (L) incident on the microcavity (2) through the first mirror (3) with the polarization of the second optical mode (V).

* * * * *